(12) United States Patent
Bao et al.

(10) Patent No.: US 12,107,168 B2
(45) Date of Patent: Oct. 1, 2024

(54) INDEPENDENT GATE LENGTH TUNABILITY FOR STACKED TRANSISTORS

(71) Applicant: International Business Machines Corporation, Armonk, NY (US)

(72) Inventors: Ruqiang Bao, Niskayuna, NY (US); Junli Wang, Slingerlands, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 17/411,618

(22) Filed: Aug. 25, 2021

(65) Prior Publication Data

US 2023/0068484 A1   Mar. 2, 2023

(51) Int. Cl.
*H01L 29/78* (2006.01)
*H01L 29/06* (2006.01)
(Continued)

(52) U.S. Cl.
CPC ...... *H01L 29/7855* (2013.01); *H01L 29/0665* (2013.01); *H01L 29/0847* (2013.01); *H01L 29/1033* (2013.01)

(58) Field of Classification Search
CPC ............ H01L 29/7855; H01L 29/0665; H01L 29/0847; H01L 29/1033; H01L 29/775; H01L 21/823412; H01L 21/823807; H01L 21/8221; H01L 21/823456; H01L 21/82385; H01L 27/0688; H01L 27/088; H01L 27/092; H01L 29/0673; H01L 29/66439; H01L 29/66545; H01L 27/1211; H01L 29/42392; H01L 29/78696; B82Y 10/00
(Continued)

(56) References Cited

U.S. PATENT DOCUMENTS 7,026,688 B2   4/2006   Kim et al.
7,498,630 B2   3/2009   Ichige et al.
(Continued)

FOREIGN PATENT DOCUMENTS

DE   102020102331 A1 *   9/2020   ........... G06F 9/3001

OTHER PUBLICATIONS

International Search Report dated Aug. 25, 2022, received in a corresponding foreign application, 8 pages.
(Continued)

*Primary Examiner* — Jami Valentine Miller
*Assistant Examiner* — Pratiksha Jayant Lohakare
(74) *Attorney, Agent, or Firm* — Scully, Scott, Murphy & Presser, P.C.; Samuel Waldbaum

(57) ABSTRACT

A stacked FET structure having independently tuned gate lengths is provided to maximize the benefit of each FET within the stacked FET structure. Notably, a vertically stacked FET structure is provided in which a bottom FET has a different gate length than a top FET. In some embodiments, a dielectric spacer can be present laterally adjacent to the bottom FET and the top FET. In such an embodiment, the dielectric spacer can have a first portion that is located laterally adjacent to the bottom FET that has a different thickness than a second portion of the dielectric spacer that is located laterally adjacent the top FET.

6 Claims, 30 Drawing Sheets

(51) Int. Cl.
*H01L 29/08* (2006.01)
*H01L 29/10* (2006.01)

(58) Field of Classification Search
USPC .......................................................... 257/33
See application file for complete search history.

(56) References Cited

U.S. PATENT DOCUMENTS

| | | | |
|---|---|---|---|
| 8,802,565 B2 | 8/2014 | Hartig et al. | |
| 8,952,438 B2 | 2/2015 | Shim et al. | |
| 9,184,053 B2 | 11/2015 | Shinohara et al. | |
| 9,520,330 B2 | 12/2016 | Andrieu et al. | |
| 10,224,329 B2 | 3/2019 | Cheng et al. | |
| 10,734,511 B2* | 8/2020 | Huang | H01L 29/7391 |
| 10,832,907 B2 | 11/2020 | Cheng et al. | |
| 10,847,629 B2 | 11/2020 | Lee | |
| 10,903,315 B2* | 1/2021 | Loubet | H01L 29/7851 |
| 10,923,474 B2 | 2/2021 | Liaw | |
| 11,121,044 B2* | 9/2021 | Cheng | B82Y 10/00 |
| 2008/0061371 A1* | 3/2008 | Kang | H10B 99/00 |
| | | | 257/E29.151 |
| 2011/0049624 A1* | 3/2011 | Guo | H01L 29/7839 |
| | | | 257/E21.415 |
| 2013/0334610 A1* | 12/2013 | Moroz | H01L 23/528 |
| | | | 257/E21.632 |
| 2015/0279975 A1* | 10/2015 | Hsiao | H01L 29/7854 |
| | | | 438/283 |
| 2017/0040315 A1 | 2/2017 | Balakrishnan et al. | |
| 2019/0131396 A1 | 5/2019 | Zhang et al. | |
| 2019/0326286 A1* | 10/2019 | Xie | H01L 29/401 |
| 2019/0393249 A1* | 12/2019 | Lilak | H01L 27/0688 |
| 2020/0006130 A1* | 1/2020 | Chang | H01L 21/02118 |
| 2020/0105869 A1* | 4/2020 | Loubet | H01L 29/7851 |
| 2020/0126987 A1* | 4/2020 | Rubin | H01L 29/0847 |
| 2020/0287046 A1* | 9/2020 | Frougier | H01L 21/823431 |
| 2021/0210349 A1 | 7/2021 | Xie et al. | |
| 2021/0407980 A1* | 12/2021 | Young | H01L 29/4175 |

OTHER PUBLICATIONS

Loubet, N., et al., "Stacked Nanosheet Gate-All-Around Transistor to Enable Scaling Beyond FinFET", 2017 Symposium on VLSI Technology Digest of Technical Papers, Date of Conference:Jun. 5-8, 2017, 2 pages.
Wu, S.Y., "Key Technology Enablers of Innovations in the AI and 5G Era", 2019 IEEE International Electron Devices Meeting (IEDM), Date of Conference: Dec. 7-11, 2019, 4 pages.

* cited by examiner

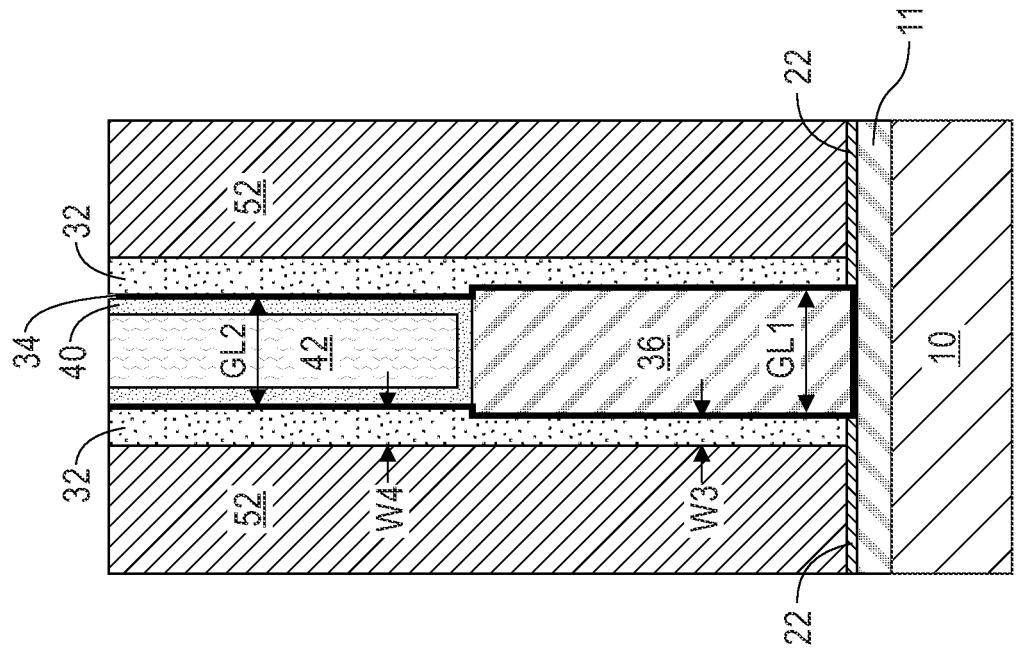
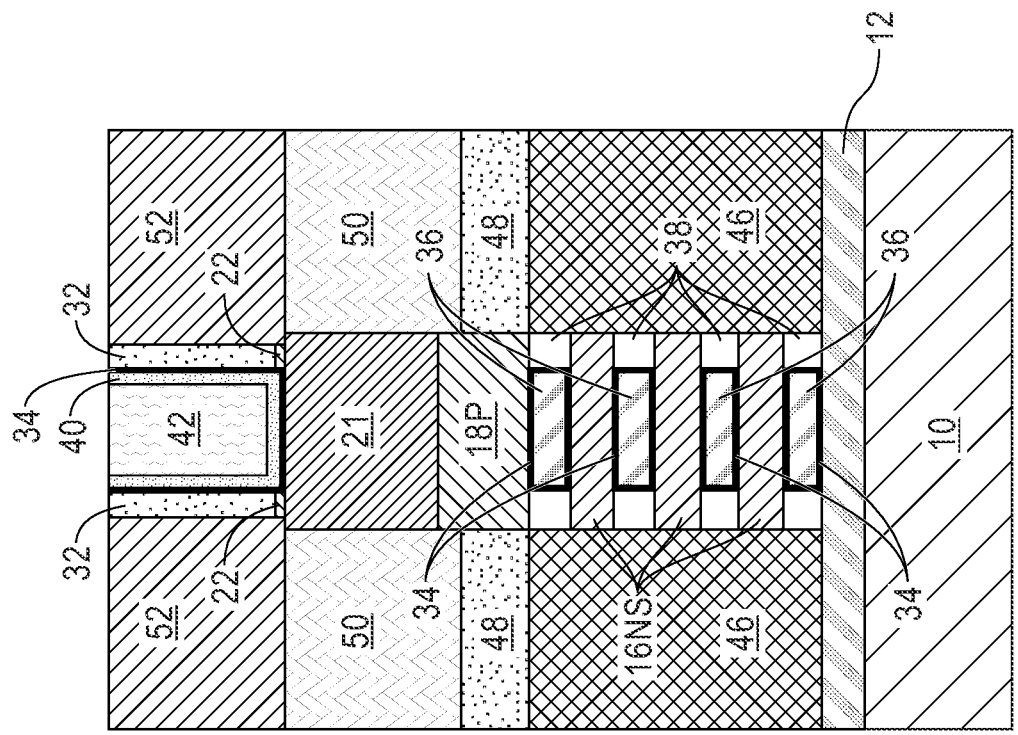
FIG. 11C
FIG. 11B

INDEPENDENT GATE LENGTH TUNABILITY FOR STACKED TRANSISTORS

BACKGROUND

The present application relates to semiconductor technology, and more particularly to a semiconductor structure having stacked field effect transistors (FETs) with different and tunable gate lengths.

Complementary metal oxide semiconductor (CMOS) technology is commonly used for FETs as part of advanced integrated circuits, such as central processing units, memory, storage devices, and the like. As demands to reduce the dimensions of transistor devices continue, stacked FETs help achieve a reduced FET device footprint, while maintaining FET device performance. A stacked FET is a structure in which one FET is vertically stacked atop another FET. For example, a p-type FET can be stacked above an n-type FET, or an n-type FET can be stacked above a p-type FET. Stacked FETs use less surface area of a die than conventional FETs and is needed with shrinking design rules.

In stacked FET technology, there is a need to provide a stacked FET structure in which different gate lengths are independently provided to maximize the benefit of each FET. For example, threshold voltage, Vt, tunablity by different gate lengths is generally needed if the stacked FETs are the same; a p-type FET has more Vt roll-off than an n-type FET so shrinking a p-type FET independently could achieve a lower Vt.

Also, when two types of FETs (i.e., n-type and p-type FETs) are stacked, a different gate length is required to maximize the benefits for each of the FETs. For example, in a stacked FET, one FET could be located on a semiconductor fin (i.e., FinFET), while another FET can be wrapped around a nanosheet stack of semiconductor channel material nanosheets (i.e., nanosheet FET). More benefits can be achieved when the nanosheet FET is designed to have a smaller gate length than the FinFET because of better electrostatics coming from the nanosheet FET.

SUMMARY

A stacked FET structure having independently tuned gate lengths is provided to maximize the benefit of each FET within the stacked FET structure. Notably, a vertically stacked FET structure is provided in which a bottom FET has a different gate length than a top FET. In some embodiments, a dielectric spacer can be present laterally adjacent to the bottom FET and the top FET. In such an embodiment, the dielectric spacer can have a first portion that is located laterally adjacent to the bottom FET that has a different thickness than a second portion of the dielectric spacer that is located laterally adjacent the top FET.

In one aspect of the present application, a semiconductor structure is provided. In one embodiment, the semiconductor structure includes a bottom FET and a top FET stacked in a vertical manner one atop the other, wherein the bottom FET has a first gate length, and the top FET has a second gate length that differs from the first gate length. In accordance with the present application, each of the bottom FET and the top FET is one of a planar FET, a FinFET, and a nanosheet FET.

In one embodiment, the bottom FET is a nanosheet FET and the top FET is a FinFET. In another embodiment, the bottom FET is a FinFET, and the top FET is a nanosheet FET. In some embodiments, both the bottom and top FETs are nanosheet FETs. In yet other embodiments, both the bottom and top FETs are planar FETs (n-type FET and p-type FET).

In some embodiments, the first gate length can be greater than the second gate length. In such an instance, a dielectric spacer that is present along sidewalls of the bottom FET (e.g., nanosheet FET) and the top FET (e.g., FinFET) has a first portion located laterally adjacent to the bottom FET (e.g., nanosheet FET) having a first thickness, and a second portion located laterally adjacent to the top FET (e.g., FinFET) having a second thickness that is greater than the first thickness.

In other embodiments the first gate length is less than the second gate length. In such an instance, a dielectric spacer that is present along sidewalls of the bottom FET (e.g., nanosheet FET) and top FET (e.g., FinFET) has a first portion located laterally adjacent to the bottom FET (e.g., nanosheet FET) having a first thickness, and a second portion located laterally adjacent to the top FET (e.g., FinFET) having a second thickness that is less than the first thickness.

In another aspect of the present application, methods of forming a semiconductor structure including a bottom FET and a top FET stacked in a vertical manner one atop the other are provided in which the bottom FET has a first gate length and the top FET has a second gate length that differs from the first gate length. In one example, methods of forming a semiconductor structure including a FinFET and a nanosheet FET stacked in a vertical manner one atop the other are provided in which the FinFET has a first gate length and the nanosheet FET has a second gate length that differs from the first gate length.

BRIEF DESCRIPTION OF THE DRAWINGS

FIG. 11B is a cross sectional view of the exemplary semiconductor structure shown in FIG. 10B after further device processing including forming a semiconductor fin from each semiconductor channel material structure and a nanosheet stack containing alternating nanosheets of sacrificial semiconductor material and semiconductor channel materials from the material stack, forming bottom and top source/drain regions, removing the modified sacrificial gate material-containing pillar and each nanosheet of sacrificial semiconductor material from the nanosheet stack, and forming a first functional gate structure having a first gate length in an area previously occupied by the recessed nanosheets of sacrificial semiconductor material and the remaining portion of the recessed first sacrificial gate material layer, and forming a second functional gate structure having a second gate length that is less than the first gate length in an area previously occupied by the remaining thinned portion of the second sacrificial gate material layer.

FIG. 11C is a cross sectional view of the exemplary semiconductor structure shown in FIG. 10C after further device processing including forming a semiconductor fin from each semiconductor channel material structure and a nanosheet stack containing alternating nanosheets of sacrificial semiconductor material and semiconductor channel materials from the material stack, forming bottom and top source/drain regions, removing the modified sacrificial gate material-containing pillar and each nanosheet of sacrificial semiconductor material from the nanosheet stack, and forming a first functional gate structure having a first gate length in in an area previously occupied by the recessed nanosheets of sacrificial semiconductor material and the remaining portion of the recessed first sacrificial gate material layer, and forming a second functional gate structure having a second gate length that is less than the first gate length in an area previously occupied by the remaining thinned portion of the second sacrificial gate material layer.

DETAILED DESCRIPTION

Figure 2A:
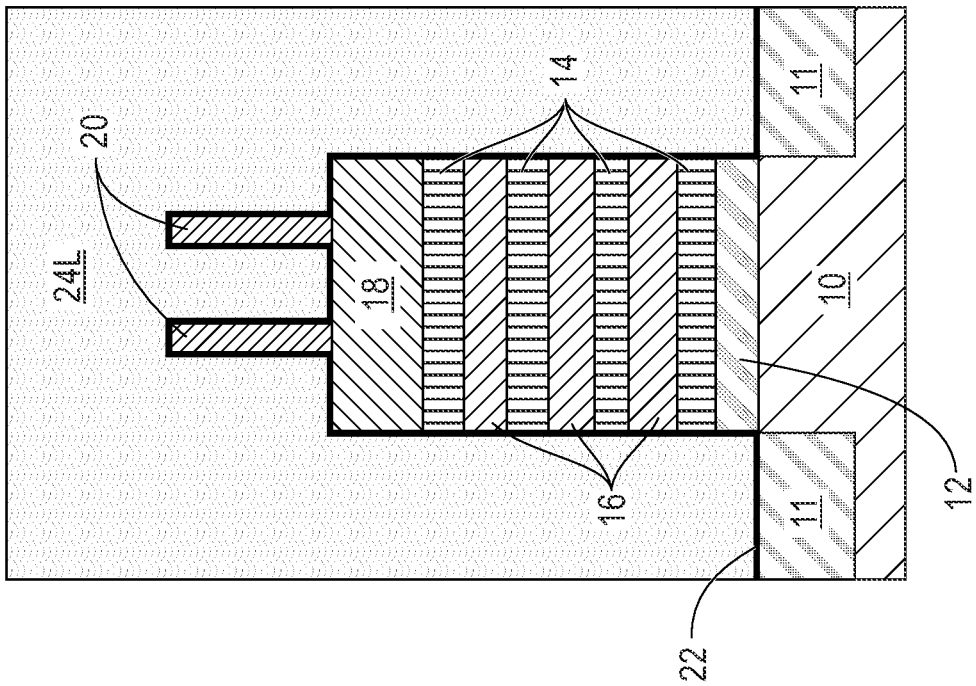
FIG. 2A is a cross sectional view of an exemplary semiconductor structure that can be employed in the present application and through Y-Y shown in FIG. 1, the exemplary structure includes a material stack of alternating layers of sacrificial semiconductor material and semiconductor channel material located on a bottom isolation layer that is located on a semiconductor substrate, a top isolation layer located on the material stack, at least one semiconductor channel material structure located on the top isolation layer, and a sacrificial gate material-containing stack including at least a first sacrificial gate material layer located on each semiconductor fin, and laterally adjacent to the material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or semiconductor substrate is referred to as being "on" or "over" another element, it can be directly on the other element or intervening elements may be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
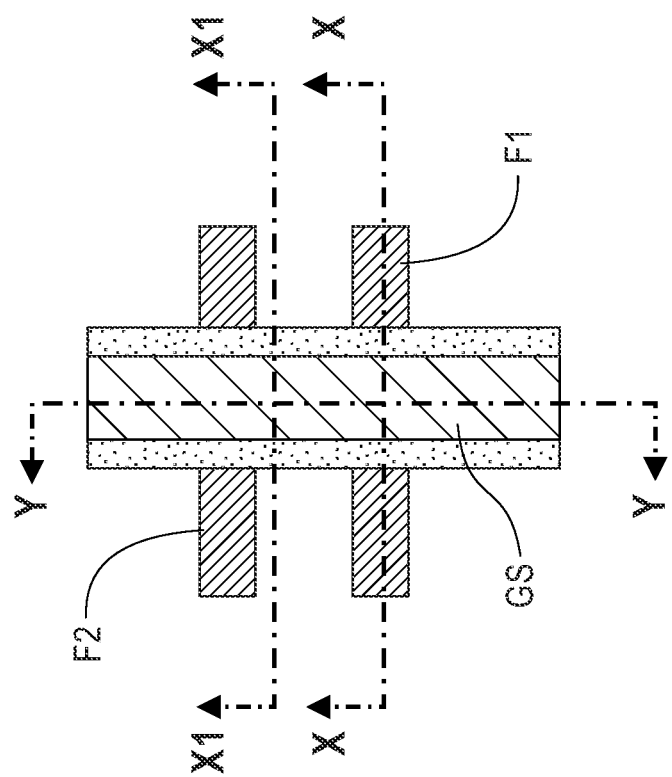
FIG. 1 is a schematic top-down view showing an exemplary device layout that can be employed in the present application, the device layout including a functional gate structure that straddles over a pair of neighboring semiconductor fins.

Reference is first made to FIG. 1, which illustrates an exemplary device layout that can be employed in the present application. The exemplary device layout includes a functional gate structure, GS, that straddles over a pair of neighboring semiconductor fins, F1 and F2. In the exemplary device layout of FIG. 1 each semiconductor fin, F1 and F2, is orientated parallel to each other and the functional gate structure, GS, lies perpendicular and passes over each of the semiconductor fins, F1 and F2. Also, shown in FIG. 1 are cuts X-X, X1-X1 and Y-Y. Cut X-X is along (and through) a lengthwise direction of semiconductor fin, F1, cut X1-X1 is located in an area (i.e., a non-active device area) that is located between the semiconductor fins, F1 and F2, and cut Y-Y is along (and through) a lengthwise direction of the functional gate structure, GS. Cuts X-X and X1-X1 are parallel to each other and cut Y-Y is perpendicular to both cuts X-X and X-X1.

The aforementioned cuts X-X, X1-X1, and Y-Y will be used in some of the drawings of the present application to describe and illustrate the stacked FET structure during different processing steps of the present application. Notably, and in the present application, FIGS. 2A, 3A, 4A, 5A, 6A, 7A, 8A, 9A, 10A and 11A are cross sectional views through Y-Y; FIGS. 2B, 3B, 4B, 5B, 6B, 7B, 8B, 9B, 10B and 11B are cross sectional views through X-X; and FIGS. 2C, 3C, 4C, 5C, 6C, 7C, 8C, 9C, 10C and 11C are cross sectional views through X1-X1.

In the following description, methods of forming a semiconductor structure including a FinFET and a nanosheet FET stacked in a vertical manner one atop the other are provided in which the FinFET has a first gate length and the nanosheet FET has a second gate length that differs from the first gate length. Although the present application exemplifies FinFETs and nanosheet FETs, the methods described herein can be altered to provide any type of bottom and top FET stacked one atop the other. For example, and in one alternative embodiment for forming stacked nanosheet FETs having different gate lengths, the process used to form the FinFET described herein below is replaced with another process that provides the nanosheet FET; this another process that provides the nanosheet FET can be the same as the nanosheet process flow described herein below.

Figure 2C:
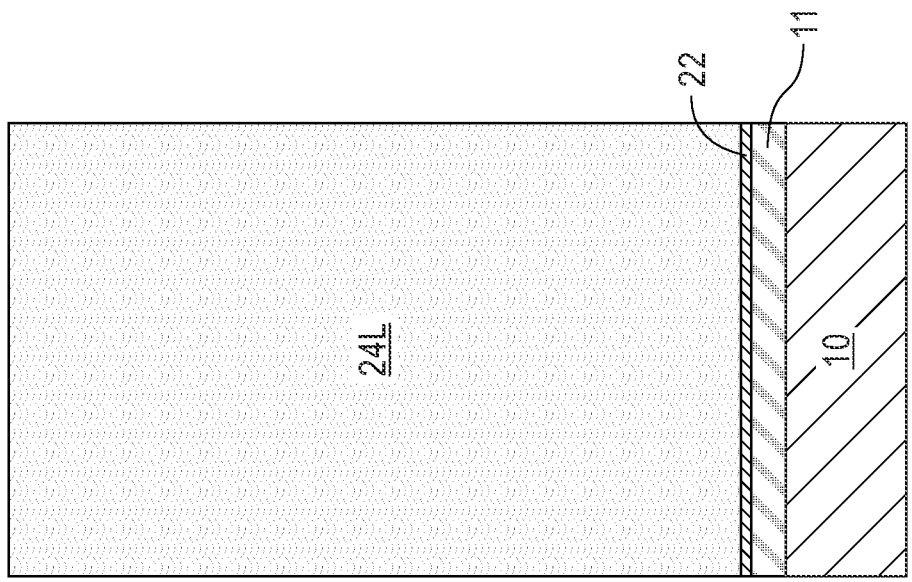
FIG. 2C is a cross sectional view of an exemplary semiconductor structure that can be employed in the present application and through X1-X1 shown in FIG. 1, the exemplary structure includes a material stack of alternating layers of sacrificial semiconductor material and semiconductor channel material located on a bottom isolation layer that is located on a semiconductor substrate, a top isolation layer located on the material stack, at least one semiconductor channel material structure located on the top isolation layer, and a sacrificial gate material-containing stack including at least a first sacrificial gate material layer located on each semiconductor fin, and laterally adjacent to the material stack.
Figure 2B:
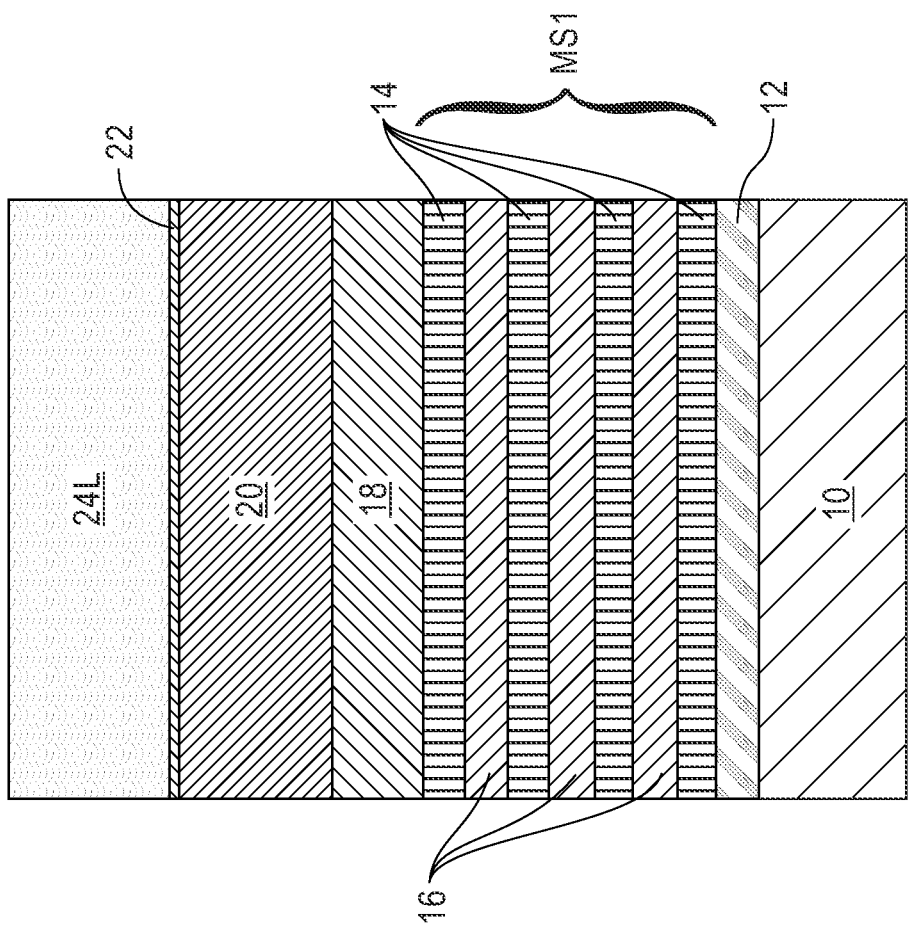
FIG. 2B is a cross sectional view of an exemplary semiconductor structure that can be employed in the present application and through X-X shown in FIG. 1, the exemplary structure includes a material stack of alternating layers of sacrificial semiconductor material and semiconductor channel material located on a bottom isolation layer that is located on a semiconductor substrate, a top isolation layer located on the material stack, at least one semiconductor channel material structure located on the top isolation layer, and a sacrificial gate material-containing stack including at least a first sacrificial gate material layer located on each semiconductor fin, and laterally adjacent to the material stack.

Referring now to FIGS. 2A, 2B and 2C, there are illustrated an exemplary semiconductor structure that can be employed in the present application and through Y-Y, X-X, and X1-X1, respectively. Notably, the exemplary structure shown in FIGS. 2A, 2B and 2C includes a material stack, MS1, of alternating layers of sacrificial semiconductor material 14 and semiconductor channel material 16 located on a bottom isolation layer 12 that is located on a semiconductor substrate 10. In some embodiments, the bottom isolation layer 12 can be omitted, and in such an embodiment, the material stack, MS1, can be located on a surface of semiconductor substrate 10. In some embodiments and as is shown in FIG. 2A, a trench isolation structure 11 can be located in the semiconductor substrate 10 so as to define an active device area in which the material stack, MS1, is formed thereon. The active device area is an upper portion of the semiconductor substrate 10 that is laterally surrounded by the trench isolation structure 11. Each layer of semiconductor channel material 16 is a precursor of a nanosheet stack containing vertical stacked and spaced apart semiconductor channel material nanosheets that are used as an active channel material of a nanosheet FET device of the present application.

The exemplary structure of FIGS. 2A, 2B and 2C further includes a top isolation layer 18 located on the material stack, MS1, at least one semiconductor channel material structure 20 (two semiconductor channel material structures are shown by way of one example) located on the top isolation layer 18, and a sacrificial gate material-containing stack including at least a first sacrificial gate material layer 24L is located on the top isolation layer 18 and on each semiconductor channel material structure 20, and laterally adjacent to the material stack, MS1. In addition to the first sacrificial gate material layer 24L, the sacrificial gate material-containing stack can also include a sacrificial gate dielectric material layer 22. In some embodiments, the sacrificial gate dielectric material layer 22 can be omitted. Each semiconductor channel material structure is a precursor of a semiconductor fin that is used as an active channel material of a FinFET device of the present application.

The sacrificial gate material-containing stack can be located on physically exposed surfaces (i.e., topmost and sidewall surfaces) of each semiconductor channel material structure 20, on the physical exposed surfaces (topmost and sidewall surfaces) of the top isolation layer 18, along the sidewall surfaces of the material stack, MS1, along the sidewall surfaces of the bottom isolation layer 12, if the same is present, and on the topmost surface of the trench isolation structure 11.

The semiconductor substrate 10 can be composed of one or more semiconductor materials. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments, the entirety of the semiconductor substrate 10 is composed of one or more semiconductor materials. In such an embodiment, semiconductor substrate 10 can be referred to a bulk semiconductor substrate.

In another embodiment of the present application, semiconductor substrate 10 can be composed of a multilayered stack of from bottom to top, a bottom semiconductor material layer, an insulator material layer, and a top semiconductor material layer. Such a semiconductor substrate 10 can be referred to as a semiconductor-on-insulator (SOI) substrate. In such an embodiment, the top and bottom semiconductor material layers can be composed of one of the semiconductor materials mentioned above, and the insulator material layer can be composed of a dielectric material such as, for example, silicon oxide, and/or boron nitride. An SOI substrate can be made utilizing processing techniques well known to those skilled in the art. For example, a SOI substrate can be formed by a process referred to as a SIMOX (separation by ion implantation of oxygen) in which oxygen ions are implanted into a bulk semiconductor material and then an anneal is performed to convert the implanted oxygen region into an oxide layer. Alternatively, the SOI substrate can be formed by a bonding process in which an oxide (an/or boron nitride) layer that is formed on a semiconductor material layer is bonded to a base semiconductor material layer.

The trench isolation structure 11 can be composed of a trench dielectric material such as, for example, silicon dioxide, silicon nitride, silicon oxynitride, or any suitable combination of those dielectric materials. The trench isolation structure 11 can have a topmost surface that is coplanar with a topmost surface of the semiconductor substrate 10 that defines the active device area. In some embodiments, the trench isolation structure 11 can be omitted. The trench isolation structure 11 can be formed by first forming a trench into the semiconductor substrate. The trench can be formed by lithography and etching. The trench is then filled with one of the trench dielectric materials mentioned above. An optional planarization process (such as, for example, chemical mechanical polishing (CMP)) and/or densification process can be performed after the trench fill process. The trench isolation structure 11 defines a non-active device area.

When present, the bottom isolation layer 12 is composed of a dielectric material such as, for example, silicon dioxide, silicon nitride, silicon oxynitride, or any suitable combination of those dielectric materials. In some embodiments, the bottom isolation layer 12 is omitted from the structure. When present, the bottom isolation layer 12 can have a thickness from 5 nm to 30 nm; although other thicknesses for the bottom isolation layer 12 are contemplated and can be used in the present application as the thickness of the bottom isolation layer 12. If present, a blanket layer of the dielectric material that provides the bottom isolation layer 12 can be formed on the surface of the semiconductor substrate 10 including the trench isolation structure 11 by a deposition process including, but not limited to, chemical vapor deposition (CVD), plasma enhanced chemical vapor deposition (PECVD) or physical vapor deposition (PVD). The blanket layer of dielectric material that provides the bottom isolation layer 12 can then be patterned during a patterning process used to form the material stack, MS1. The blanket layer of dielectric material that remains after this patterning process is the bottom isolation layer 12.

As mentioned above, the material stack, MS1, includes alternating layers of sacrificial semiconductor material 14 and semiconductor channel material 16. Each layer of sacrificial semiconductor material 14 within the material stack, MS1, can be referred to as a "sacrificial semiconductor material layer", and each layer of semiconductor channel material 16 can be referred to as a "semiconductor channel material layer". As is shown and for this embodiment of the present application, each layer of semiconductor channel material 16 is sandwiched between bottom and top layers of sacrificial semiconductor material 14. The number of layers of semiconductor channel material 16 within the material stack, MS1, of this embodiment of the present application can vary so along as there is at least one layer of semiconductor channel material 16 present in the material stack, MS1, and that each layer of semiconductor channel material 16 is sandwiched between bottom and top layers of sacrificial semiconductor material 14; in this embodiment of the present application, the material stack, MS1, includes 'x' number of layers of semiconductor channel material 16 (wherein x begins at 1), and x+1 number of layers of sacrificial semiconductor material 14. By way of one example, the illustrated material stack, MS1, includes three layers of semiconductor channel material 16, and four layers of sacrificial semiconductor material 14.

Each layer of sacrificial semiconductor material 14 is composed of a first semiconductor material, while each layer of semiconductor channel material 16 is composed of a second semiconductor material that is compositionally different from the first semiconductor material. In some embodiments, the second semiconductor material that provides each layer of semiconductor channel material 16 is a semiconductor material that is capable of providing high channel mobility for n-type FET devices. In other embodiments, the second semiconductor material that provides each layer of semiconductor channel material 16 is a semiconductor material that is capable of providing high channel mobility for p-type FET devices.

The first semiconductor material that provides each layer of sacrificial semiconductor material 14 and the second semiconductor material that provides each layer of semiconductor channel material 16 can include one of the semiconductor materials mentioned above for semiconductor substrate 10. In the present application, the first semiconductor material that provides each layer of sacrificial semiconductor material 14 can be compositionally the same as, or compositionally different from, at least an uppermost semiconductor material portion of the semiconductor substrate 10. Typically, the first semiconductor material that provides each layer of sacrificial semiconductor material 14 is compositionally different from at least the uppermost semiconductor material portion of the semiconductor substrate 10. The second semiconductor material that provides each layer of semiconductor channel material 16 can be compositionally the same as, or compositionally different from, at least an uppermost semiconductor material portion of the semiconductor substrate 10. Typically, the second semiconductor material that provides each layer of semiconductor channel material 16 is compositionally the same as at least the uppermost semiconductor material portion of the semiconductor substrate 10. In one example, the semiconductor substrate 10 is composed silicon, the first semiconductor material that provides each layer of sacrificial semiconductor material 14 is composed of a silicon germanium alloy, and the second semiconductor material that provides each layer of semiconductor channel material 16 is composed of silicon. Other combinations of semiconductor materials are possible as long as the first semiconductor material that provides each layer of sacrificial semiconductor material 14 is compositionally different from the second semiconductor material that provides each layer of semiconductor channel material 16.

At this point of the present application, each layer of sacrificial semiconductor material 14 has a width that is the same as a width of each layer of semiconductor channel material 16. As such, and at this point of the present application, the sidewalls of each layer of sacrificial semiconductor material 14 are vertically aligned with the sidewalls of each layer of semiconductor channel material 16. A typical width for each layer of sacrificial semiconductor material 14 and each layer of semiconductor channel material 16 is from 3 nm to 10 nm. Other widths are contemplated and can be used as the widths of each layer of sacrificial semiconductor material 14 and each layer of semiconductor channel material 16.

The thickness (i.e., height) of each layer of sacrificial semiconductor material 14 can be the same or different from the thickness of each layer of semiconductor channel material 16. A typical thickness for each layer of sacrificial semiconductor material 14 and each layer of semiconductor channel material 16 is from 3 nm to 15 nm. Other thicknesses are contemplated and can be used as the thickness of each layer of sacrificial semiconductor material 14 and each layer of semiconductor channel material 16.

In addition, and although the thickness of each layer of sacrificial semiconductor material 14 is shown to be the same, the present application contemplates an embodiment in which the bottommost layer of sacrificial semiconductor material 14 that is closest to the semiconductor substrate 10 can be thicker than the remaining layers of sacrificial semiconductor material 14 within the material stack, MS1.

The material stack, MS1, including the alternating layers of sacrificial semiconductor material 14 and semiconductor channel material 16 can be formed by an epitaxially growth process, followed by a patterning process Notably, alternating layers of the first semiconductor material 14 and the second semiconductor 16 mentioned above are epitaxially grown in alternating fashion to provide alternating layers of the first and second semiconductor materials on atop the bottom isolation layer 12, if present, or atop the semiconductor substrate 10 including the trench isolation structure 11. The epitaxial grown layers are then patterned by lithography and etching to provide the material stack, MS1. The patterning process used to form the material stack, MS1, can also be used to pattern blanket layers that provide the bottom insulator layer 12 and the top insulator layer 16.

Epitaxial semiconductor material layers can be grown from gaseous or liquid precursors and may be grown using vapor-phase epitaxy (VPE), molecular-beam epitaxy (MBE), liquid-phase epitaxy (LPE), or other suitable process. In some embodiments, epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of FET being formed.

The top isolation layer 18 is composed of a dielectric material such as, for example, silicon dioxide, silicon nitride, silicon oxynitride, or any suitable combination of those dielectric materials. The top isolation layer 18 can be compositionally the same as, or compositionally different from the bottom isolation layer 12. In one embodiment, the bottom isolation layer 12 is composed of silicon nitride, while the top isolation layer 18 is composed of silicon dioxide.

The top isolation layer 18 can have a thickness from 10 nm to 100 nm; although other thicknesses for the top isolation layer 18 are contemplated and can be used in the present application as the thickness of the top isolation layer 18. A blanket layer of the dielectric material that provides the top isolation layer 18 can be formed on the surface of the material stack including the alternating layers of sacrificial semiconductor material and semiconductor channel material by a deposition process including, but not limited to, CVD, PECVD or PVD. The blanket layer of dielectric material that provides the top isolation layer 18 can then be patterned during a patterning process used to form the material stack, MS1. The blanket layer of dielectric material that remains atop the material stack, MS1, after the patterning process provides the top isolation layer 18.

At least one semiconductor channel material structure 20 is then formed on the surface of the top isolation layer 18. It is noted that although the present application describes and illustrates the formation of two semiconductor channel material structures 20 on the top isolation layer 18, the present application is not limited to forming that number of semiconductor channel material structures 20. Instead, the present application contemplates embodiments in which a single semiconductor channel material structure 20, or more than two semiconductor channel material structures 20 are formed on the top isolation layer 18. Each semiconductor channel material structure 20 is composed of one of the semiconductor materials mentioned above for the semiconductor substrate 10. The semiconductor material that provides each semiconductor channel material structure 20 can be compositionally the same as, or compositionally different from, at least an uppermost semiconductor material of semiconductor substrate 10. Each semiconductor channel material structure 20 that is formed above the material stack, MS1, is composed of a compositionally same semiconductor material. The semiconductor materials that provide each semiconductor channel material structure 20 can be selected to provide high channel mobility for n-type FET devices, or high channel mobility for p-type FET devices.

Each semiconductor channel material structure 20 is oriented parallel to each other. Each semiconductor channel material structure 20 typically has a same height and width. In one example, each semiconductor channel material structure 20 has a height as measured from a topmost surface of the top isolation layer 18 to the topmost surface of the semiconductor channel material structure 20, of from 30 nm to 200 nm, and a width, as measured from one sidewall surface of semiconductor channel material structure 20, to an opposing sidewall surface of the same semiconductor channel material structure, of from 3 nm to 15 nm. Other heights and widths besides those mentioned herein are contemplated for the semiconductor channel material structures 20 and can thus be employed in the present application. Each semiconductor channel material structures 20 can be formed by deposition of a semiconductor material, followed by a lithography and etching process. The deposition of the semiconductor material can include an epitaxial growth process.

The sacrificial gate material-containing stack including at least the first sacrificial gate material layer 24L is then formed on physically exposed surfaces (i.e., topmost and sidewall surfaces) of each semiconductor channel material structure 20, on the physical exposed surfaces (topmost and sidewall surfaces) of the top isolation layer 18, along the sidewall surfaces of the material stack, MS1, along the sidewall surfaces of the bottom isolation layer 12, if the same is present, and on the topmost surface of the trench isolation structure 11. In some embodiments, a sacrificial gate dielectric material layer 22 can be present beneath the first sacrificial gate material layer 24L.

The optional sacrificial gate dielectric material layer 22 can be composed of a sacrificial gate dielectric material such as, for example, silicon dioxide, silicon nitride, and/or silicon oxynitride. The optional sacrificial gate dielectric material layer 22 can have a thickness from 1 nm to 15 nm, although other thicknesses are contemplated and can be used as the thickness of the optional sacrificial gate dielectric material layer 22.

The first sacrificial gate material layer 24L can be composed of a first sacrificial gate material including, but not limited to, polysilicon, amorphous silicon, amorphous silicon germanium, tungsten, titanium, tantalum, aluminum, nickel, ruthenium, palladium, platinum, or alloys of such metals. When a semiconductor material is used as the first sacrificial gate material, the semiconductor material that provides the first sacrificial gate material layer 24L is compositionally different from the semiconductor material that provides each semiconductor channel material structure 20. The first sacrificial gate material layer 24L can have a thickness from 20 nm to 150 nm, although other thicknesses are contemplated and can be used as the thickness of the first sacrificial gate material layer 24L.

The sacrificial gate material-containing stack including the sacrificial gate dielectric material layer 22, if present, and the first sacrificial gate material layer 24L can be formed by deposition of the various layers that provide the sacrificial gate material-containing stack. For example, the sacrificial gate dielectric material layer 22 can be formed by a first deposition process such as, for example, CVD, PECVD, or PVD, and thereafter the first sacrificial gate material layer 24L can be formed by a second deposition process including, for example, CVD, PECVD, or PVD. In some embodiments, and when the first sacrificial gate dielectric material layer 24L is composed of a semiconductor material, an epitaxial growth process can be used to form the first sacrificial gate material layer 24L.

Figure 3A:
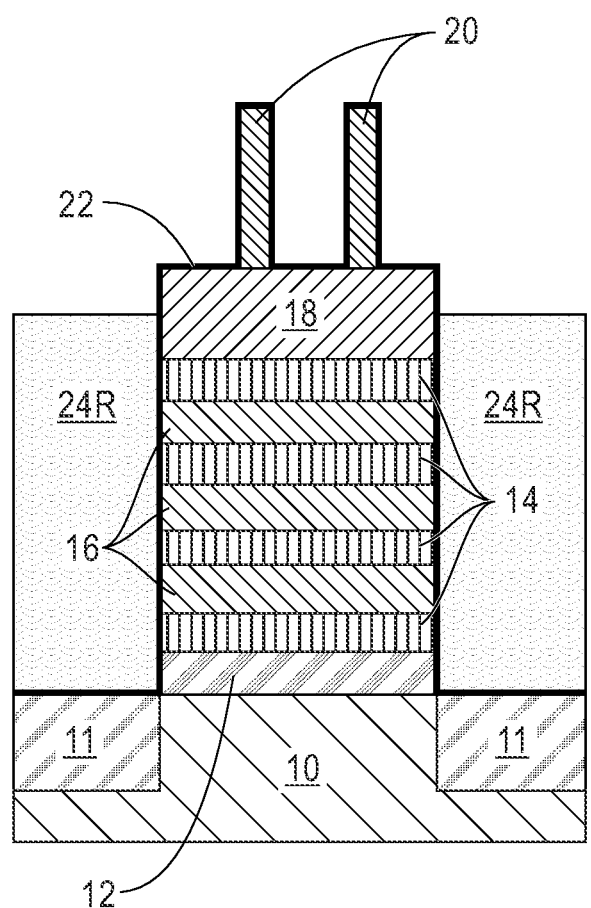
FIG. 3A is a cross sectional view of the exemplary semiconductor structure shown in FIG. 2A after recessing the first sacrificial gate material layer.
Figure 3C:
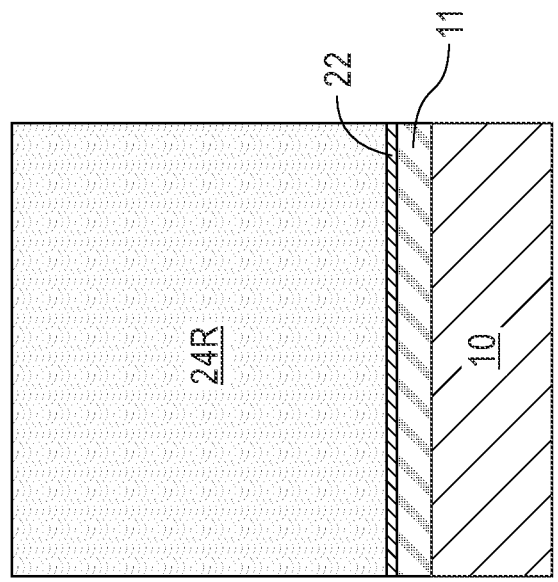
FIG. 3C is a cross sectional view of the exemplary semiconductor structure shown in FIG. 2C after recessing the first sacrificial gate material layer.
Figure 3B:
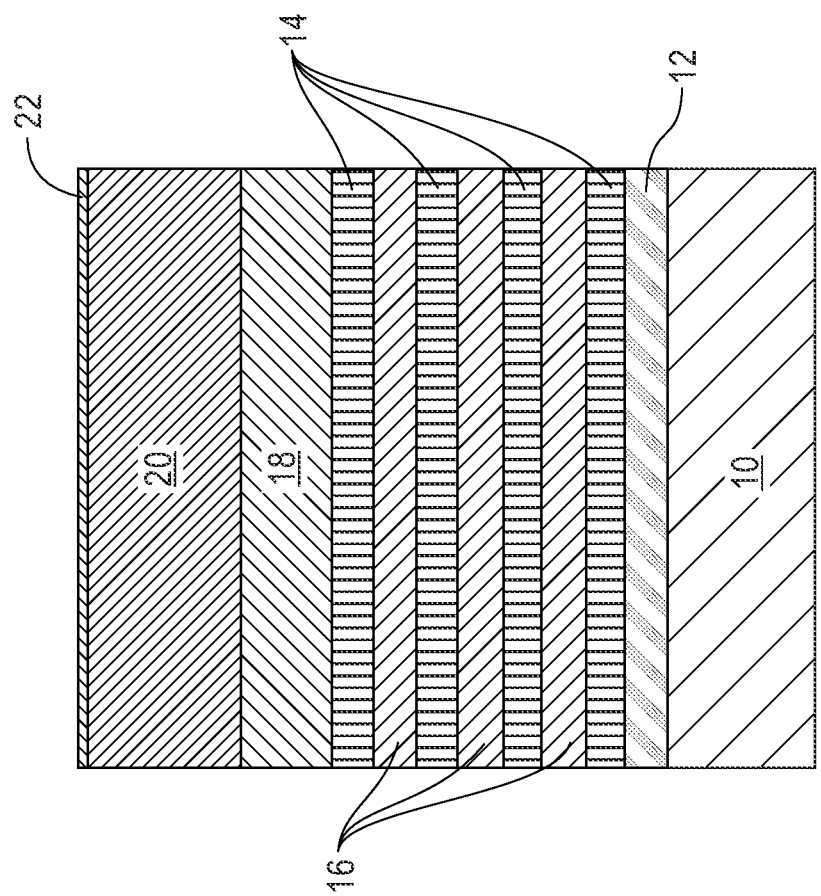
FIG. 3B is a cross sectional view of the exemplary semiconductor structure shown in FIG. 2B after recessing the first sacrificial gate material layer.

Referring now to FIGS. 3A, 3B and 3C, there are illustrated the exemplary semiconductor structure shown in FIGS. 2A, 2B and 2C, respectively, after recessing the first sacrificial gate material layer 24L to provide a recessed first sacrificial gate material layer 24R. The recessing of the first sacrificial gate material layer 24L can be performed utilizing a recess etching process (such as a reactive ion etch, or a chemical etch) that removes an upper portion of the first sacrificial gate material layer 24L. In some embodiments in which no sacrificial gate dielectric material layer 22 is present, the recessing includes a selective recessing process such as, for example, a reactive ion etch. The recessed first sacrificial gate material layer 24R has a height that is less than a height of a vertical material stack containing, the optional bottom isolation layer 12, the material stack, MS1, and the top isolation layer 18. The first sacrificial material layer 24L is removed from atop the semiconductor channel material structures 20 and form the area that is located laterally adjacent to the semiconductor channel material structures 20.

Figure 4A:
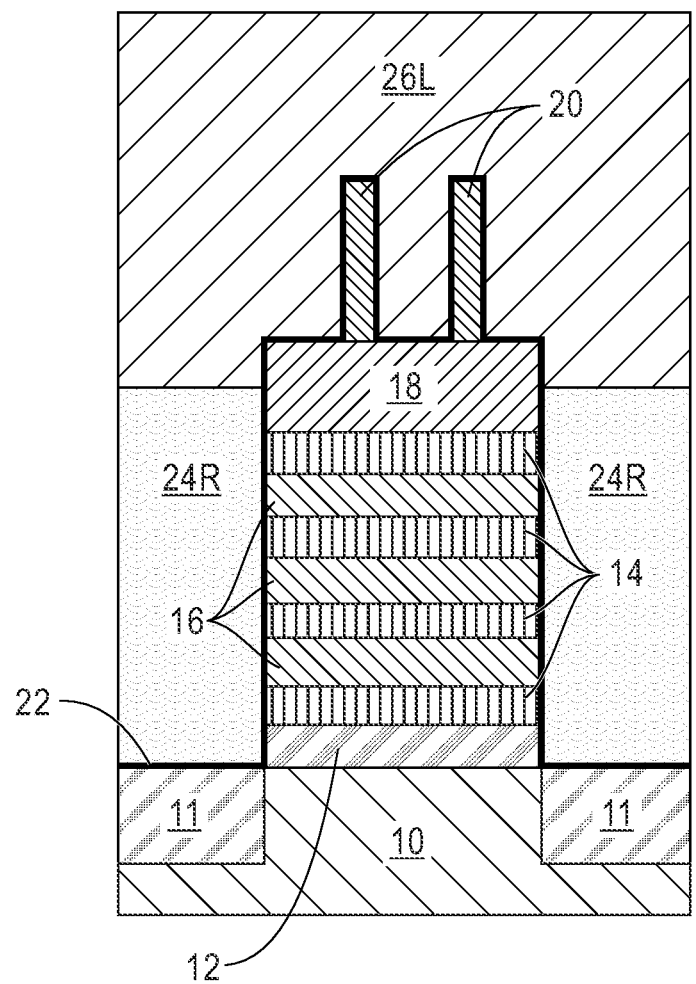
FIG. 4A is a cross sectional view of the exemplary semiconductor structure shown in FIG. 3A after forming a second sacrificial gate material layer on the recessed first sacrificial gate material layer.
Figure 4C:
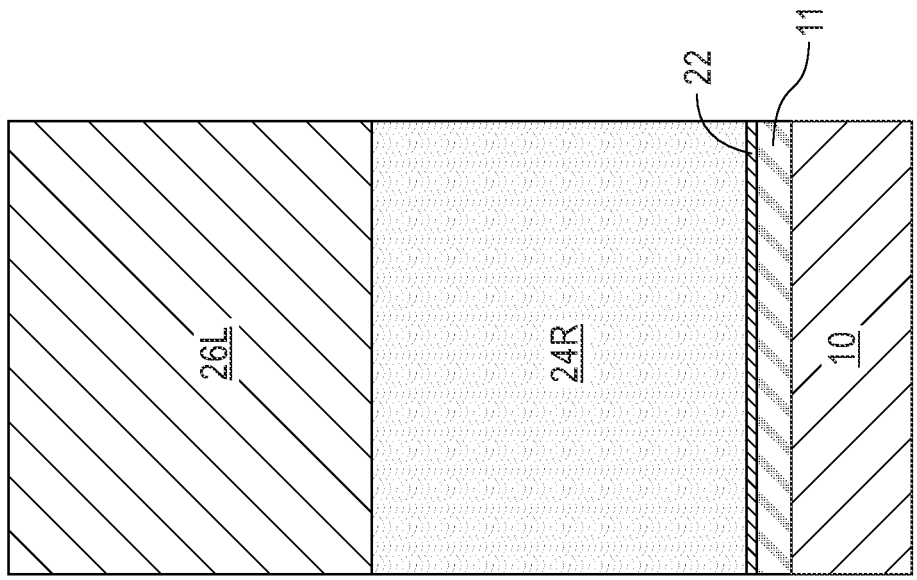
FIG. 4C is a cross sectional view of the exemplary semiconductor structure shown in FIG. 3C after forming a second sacrificial gate material layer on the recessed first sacrificial gate material layer.
Figure 4B:
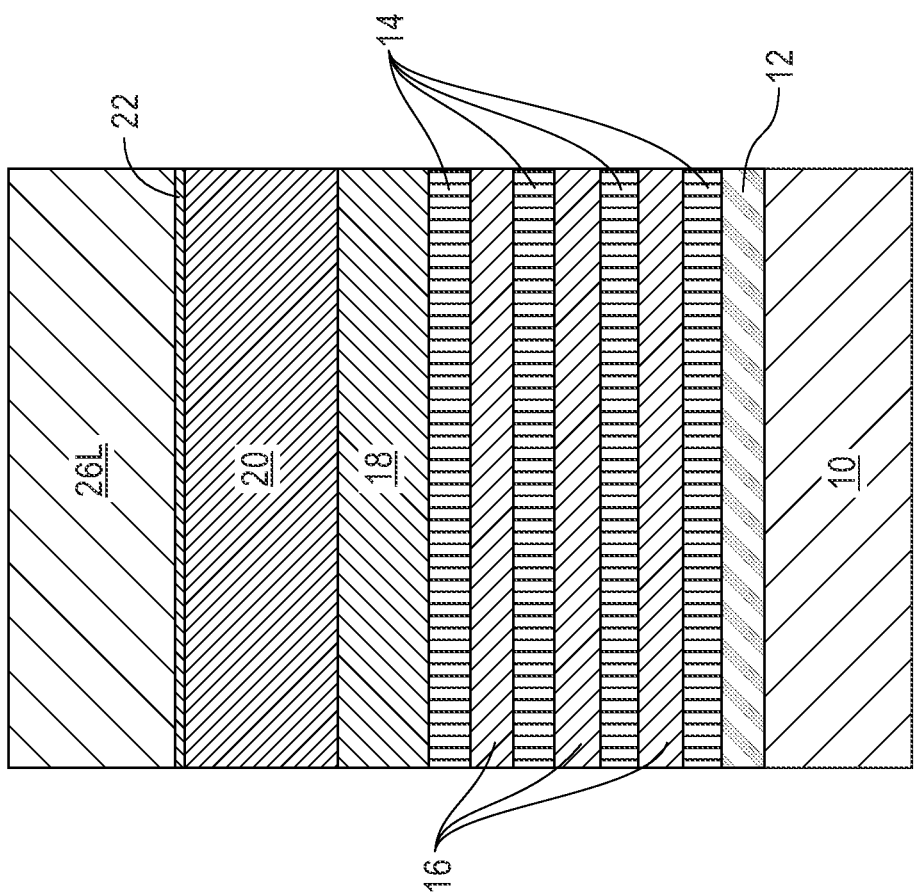
FIG. 4B is a cross sectional view of the exemplary semiconductor structure shown in FIG. 3B after forming a second sacrificial gate material layer on the recessed first sacrificial gate material layer.

Referring now to FIGS. 4A, 4B and 4C, there are shown the exemplary semiconductor structure of FIGS. 3A, 3B and 3C, respectively, after forming a second sacrificial gate material layer 26L on the recessed first sacrificial gate material layer 24R. The sacrificial gate material that provides the second sacrificial gate material 26L includes one of the sacrificial gate materials mentioned above for the first sacrificial gate material layer 24L as long as the second sacrificial gate material layer 26L is composed a sacrificial gate material that is compositionally different from the sacrificial gate material that provides the first sacrificial gate material layer 24L. The second sacrificial gate material layer 26L is formed atop the semiconductor channel material structures 20, and in the area that is located laterally adjacent to the semiconductor channel material structure 20 and laterally adjacent to an upper portion of the vertical stack containing the optional bottom isolation layer 12, the material stack, MS1, and the top isolation layer 18.

The second sacrificial gate material layer 26L can be formed utilizing a deposition process such as, for example, CVD, PECVD or PVD. When a semiconductor material is employed as the second sacrificial gate dielectric material layer 26L an epitaxial growth process can be used to form such a layer.

Figure 5A:
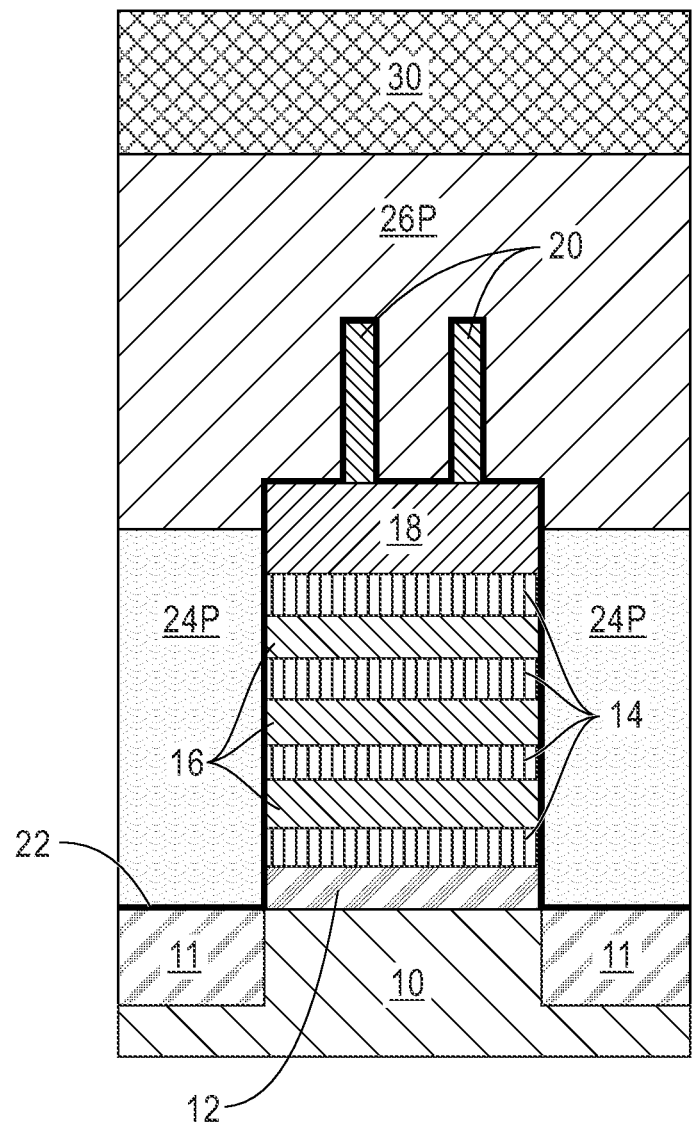
FIG. 5A is a cross sectional view of the exemplary semiconductor structure shown in FIG. 4A after patterning the second sacrificial gate material layer and the recessed first sacrificial gate material layer to provide a sacrificial gate material-containing pillar containing a remaining portion of the second sacrificial gate material layer and a remaining portion of the recessed first sacrificial gate material layer.
Figure 5C:
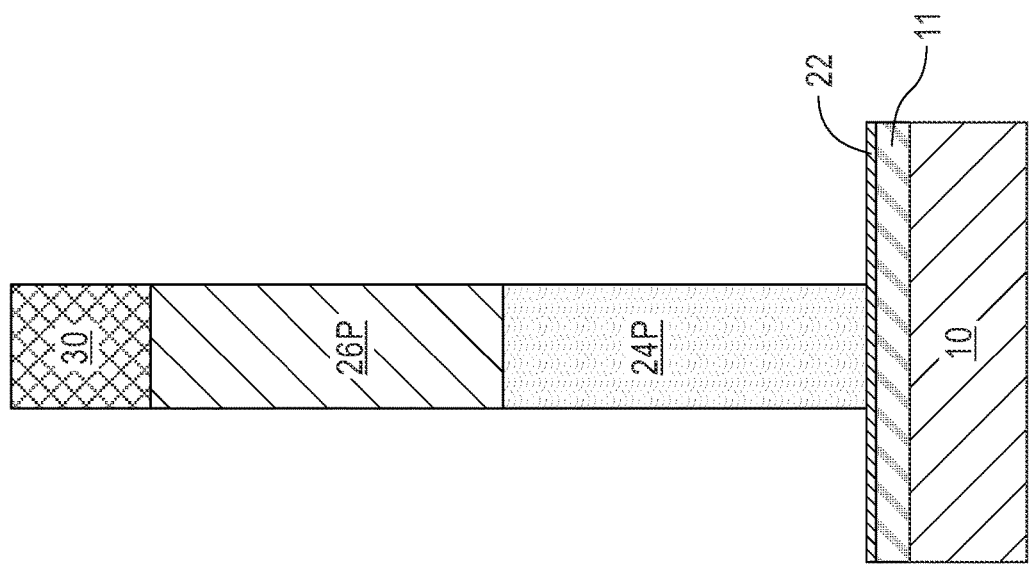
FIG. 5C is a cross sectional view of the exemplary semiconductor structure shown in FIG. 4C after patterning the second sacrificial gate material layer and the recessed first sacrificial gate material layer to provide a sacrificial gate material-containing pillar containing a remaining portion of the second sacrificial gate material layer and a remaining portion of the recessed first sacrificial gate material layer.
Figure 5B:
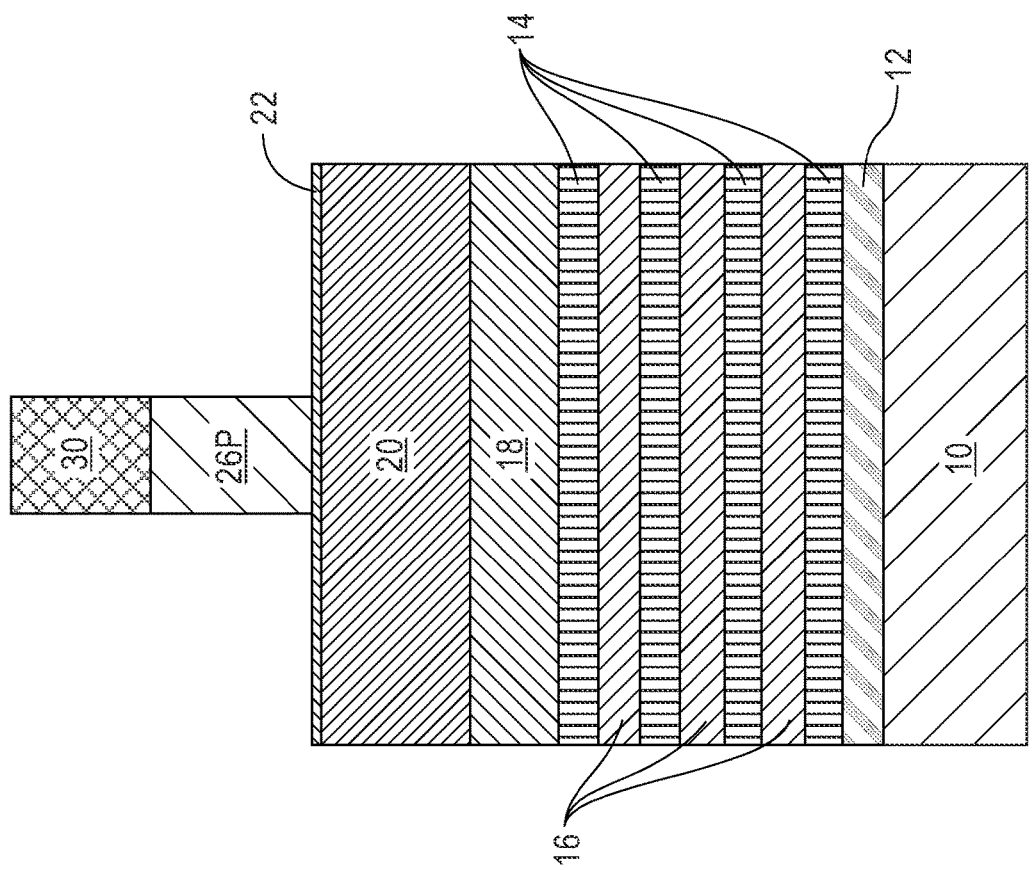
FIG. 5B is a cross sectional view of the exemplary semiconductor structure shown in FIG. 4B after patterning the second sacrificial gate material layer and the recessed first sacrificial gate material layer to provide a sacrificial gate material-containing pillar containing a remaining portion of the second sacrificial gate material layer and a remaining portion of the recessed first sacrificial gate material layer.

Referring now to FIGS. 5A, 5B and 5C, there is shown the exemplary semiconductor structure of FIGS. 4A, 4B and 4C, respectively, after patterning the second sacrificial gate material layer 26L and the recessed first sacrificial gate material layer 24L to provide a sacrificial gate material-containing pillar 24P/26P containing a remaining portion of the second sacrificial gate material layer 26L and a remaining portion of the recessed first sacrificial gate material layer 24R. The remaining portion of the second sacrificial gate material layer 26L can be referred to herein as a second sacrificial gate material portion 26P, while the remaining portion of the recessed first sacrificial gate material layer 24R can be referred to as a first sacrificial gate material portion 24P. At this point of the present application, the second sacrificial gate material portion 26 and the first sacrificial gate material portion 24P have sidewalls that are vertically aligned with each other.

The sacrificial gate material-containing pillar 24P/26P can be formed by first depositing a hard mask material layer (not shown) on the topmost surface of the second sacrificial gate material layer 26L. The hard mask material layer is composed of a hard mask material such as, for example, silicon nitride or a multilayered stack of silicon nitride and silicon dioxide. The hard mask material layer can have a thickness from 20 nm to 100 nm; although other thicknesses for the hard mask material layer are contemplated and can be employed in the present application as the thickness of the hard mask material layer.

The hard mask material layer is then patterned by lithography and etching to form a hard mask 30 on a portion of the second sacrificial gate material layer 26L. The second sacrificial gate material layer 26L and the recessed first sacrificial gate material layer 24R that are not protected by the hard mask 30 are then removed utilizing one or more etching processes. In some embodiments, and as is illustrated in at least FIGS. 5B and 5C, the one or more etching processes stop on a topmost surface of sacrificial gate dielectric material layer 22. In other embodiments, the one or more etching processes can remove portions of the sacrificial gate dielectric material layer 22 that are not protected by the hard mask 30. The sacrificial gate material-containing pillar 24P/26P containing hard mask 30 can be referred to herein as a sacrificial gate structure.

Figure 6A:
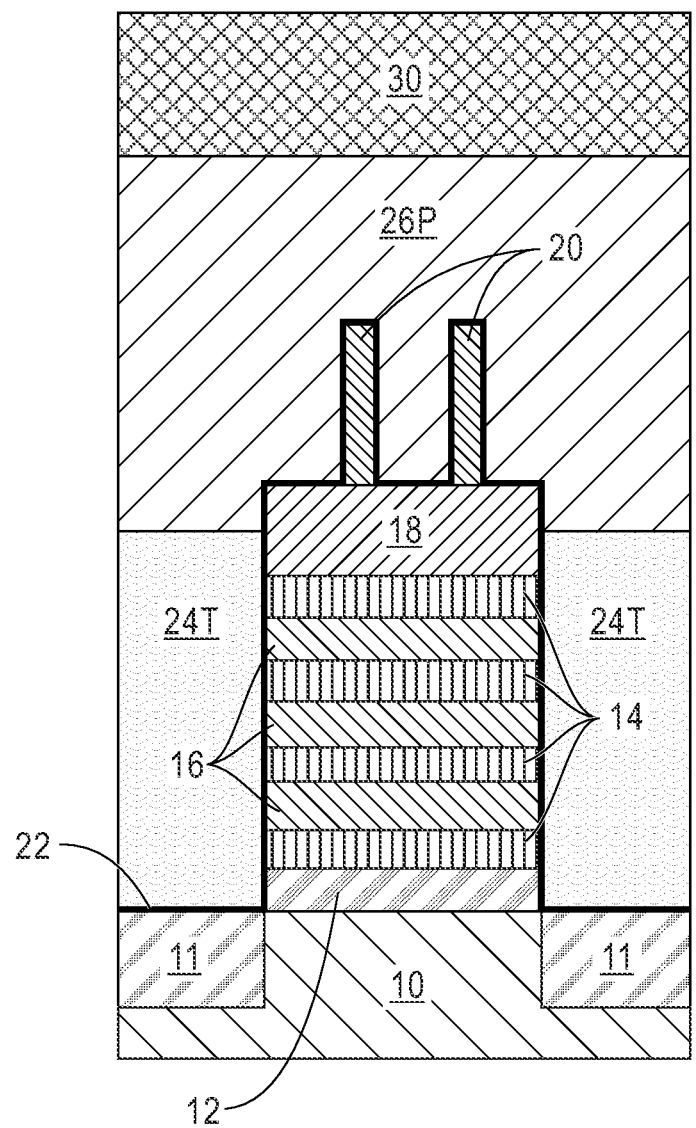
FIG. 6A is a cross sectional view of the exemplary semiconductor structure shown in FIG. 5A after thinning the recessed first sacrificial gate material layer to provide a modified sacrificial gate material-containing pillar containing the remaining portion of the second sacrificial gate material layer and a remaining thinned portion of the recessed first sacrificial gate material layer.
Figure 6C:
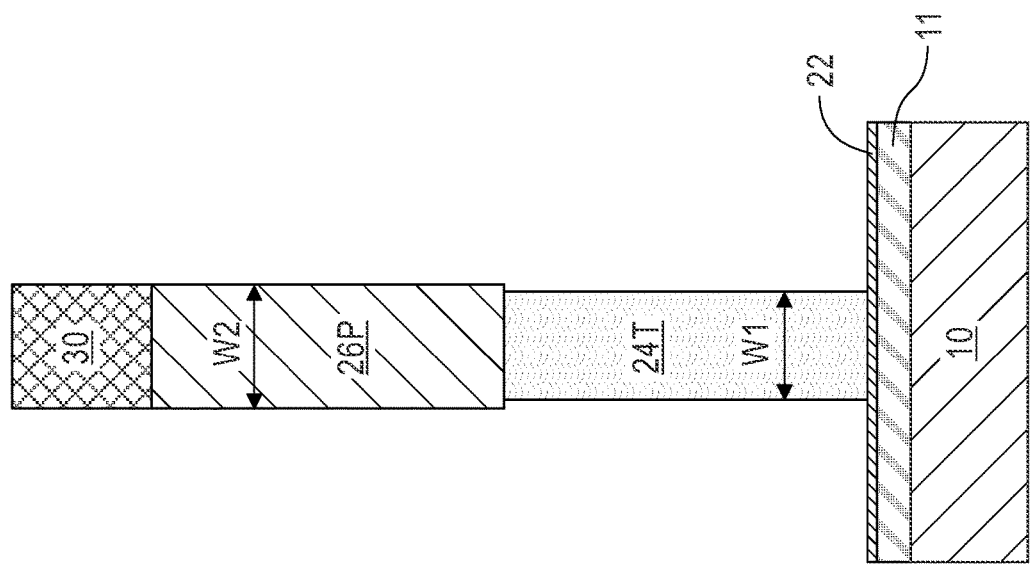
FIG. 6C is a cross sectional view of the exemplary semiconductor structure shown in FIG. 5C after thinning recessed first sacrificial gate material layer to provide a modified sacrificial gate material-containing pillar containing the remaining portion of the second sacrificial gate material layer and a remaining thinned portion of the recessed first sacrificial gate material layer.
Figure 6B:
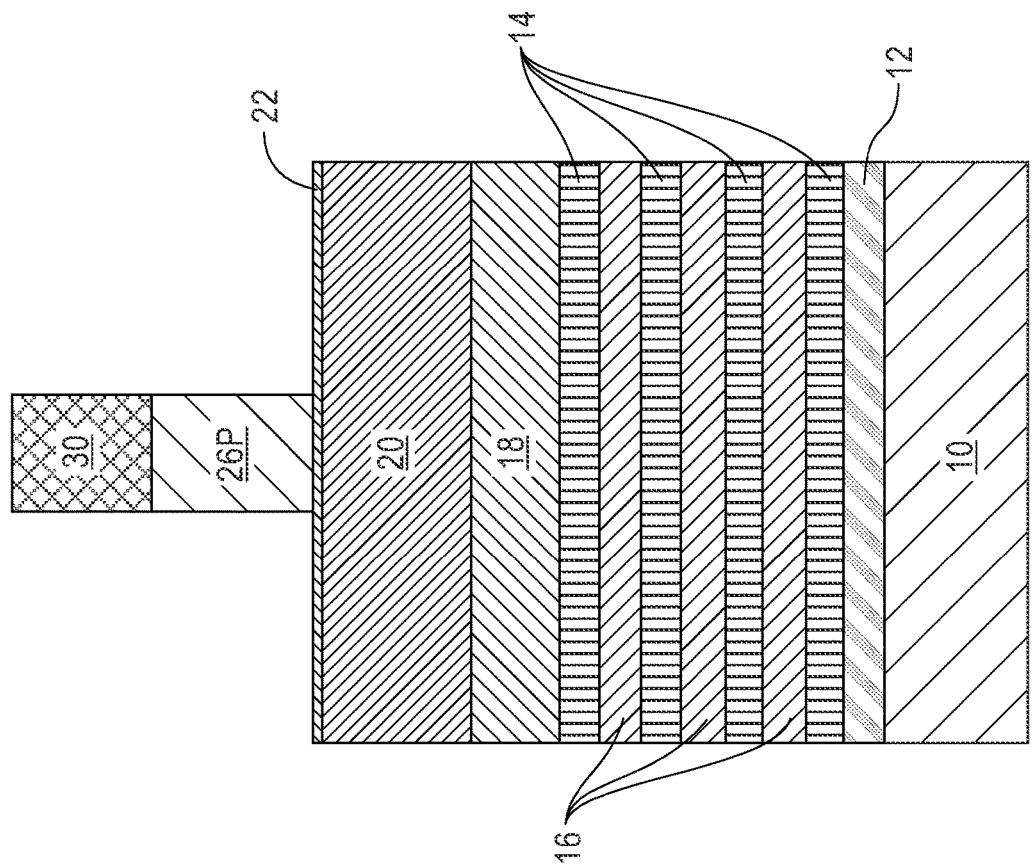
FIG. 6B is a cross sectional view of the exemplary semiconductor structure shown in FIG. 5B after thinning the recessed first sacrificial gate material layer to provide a modified sacrificial gate material-containing pillar containing the remaining portion of the second sacrificial gate material layer and a remaining thinned portion of the recessed first sacrificial gate material layer.

Referring now to FIGS. 6A, 6B and 6C, there are shown the exemplary semiconductor structure of FIGS. 5A, 5B and 5C, respectively, after thinning the recessed first sacrificial gate material layer (i.e., the first sacrificial gate material portion 24P) to provide a modified sacrificial gate material-containing pillar 24T/26P containing the remaining portion of the second sacrificial gate material layer (i.e., second sacrificial gate material portion 26P) and a remaining thinned portion of the recessed first sacrificial gate material layer (i.e., the first sacrificial gate material portion 24P). The remaining thinned portion of the recessed first sacrificial gate material layer (i.e., the first sacrificial gate material portion 24P) can be referred herein as a trimmed first sacrificial gate material portion 24T. As is shown in FIG. 6C, the trimmed first sacrificial gate material portion 24T has a first width, W1, and the second sacrificial gate material portion 26P has a second width, W2. In accordance with this embodiment of the present application W1 is less than W2. In one example, W1 is from 10 nm to 200 nm, while W2 is from 12 nm to 200 nm.

This thinning step includes a trimming process such as, an etch, that is selective in removing the sacrificial gate material that provides the first sacrificial gate material layer 24L as compared to the sacrificial gate material that provides the second sacrificial gate material layer 26L. In one example, the etch includes a chemical wet etching process.

Figure 7A:
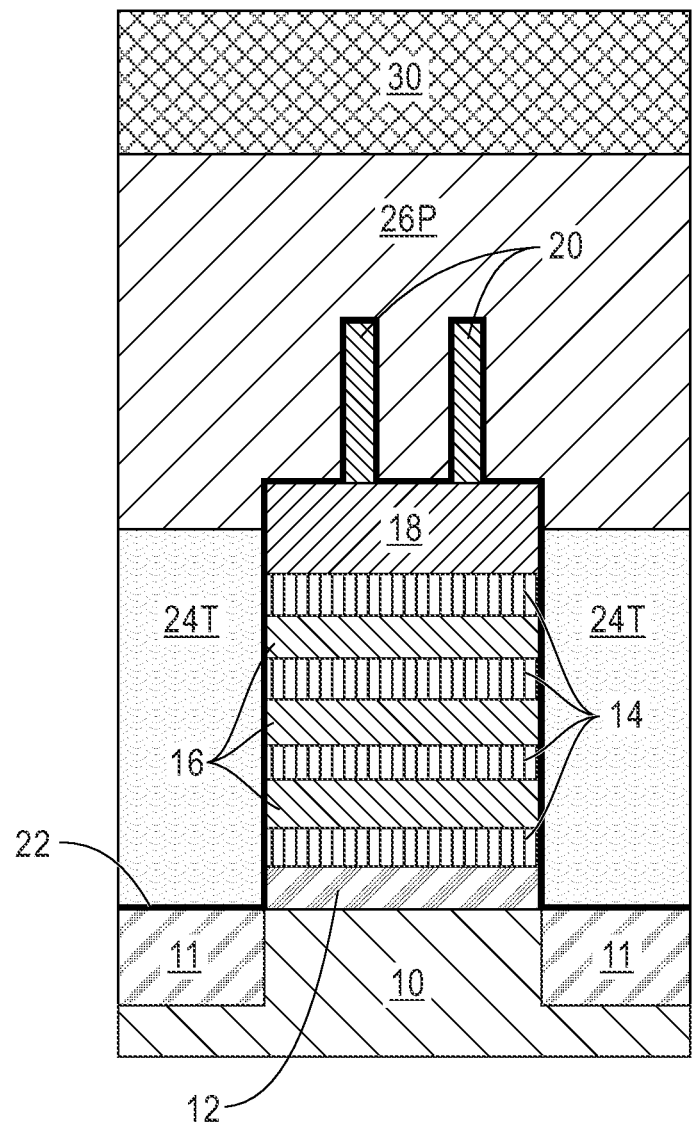
FIG. 7A is a cross sectional view of the exemplary semiconductor structure shown in FIG. 6A after forming a dielectric spacer along the physically exposed sidewall of the modified sacrificial gate material-containing pillar.
Figure 7C:
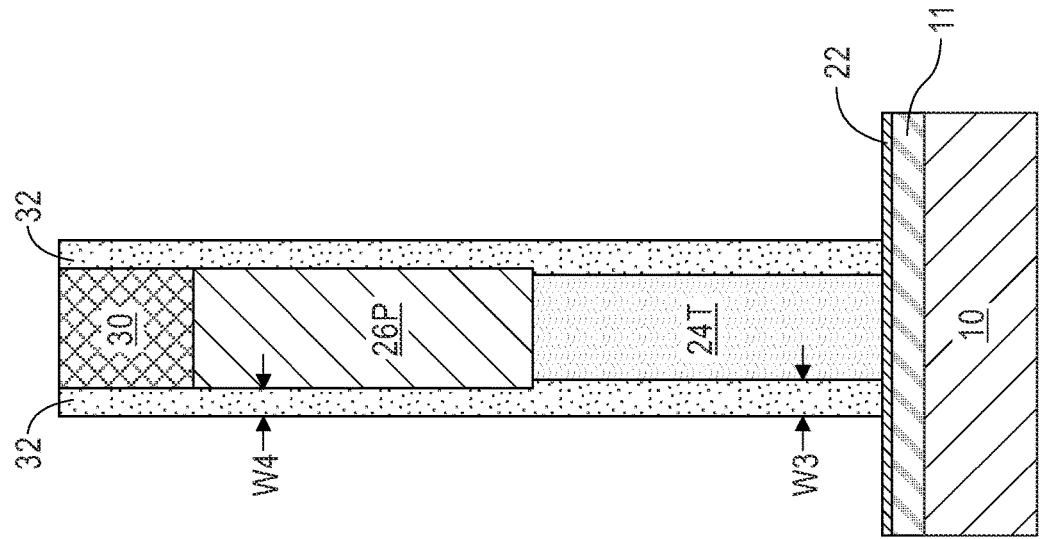
FIG. 7C is a cross sectional view of the exemplary semiconductor structure shown in FIG. 6C after forming a dielectric spacer along the physically exposed sidewall of the modified sacrificial gate material-containing pillar.
Figure 7B:
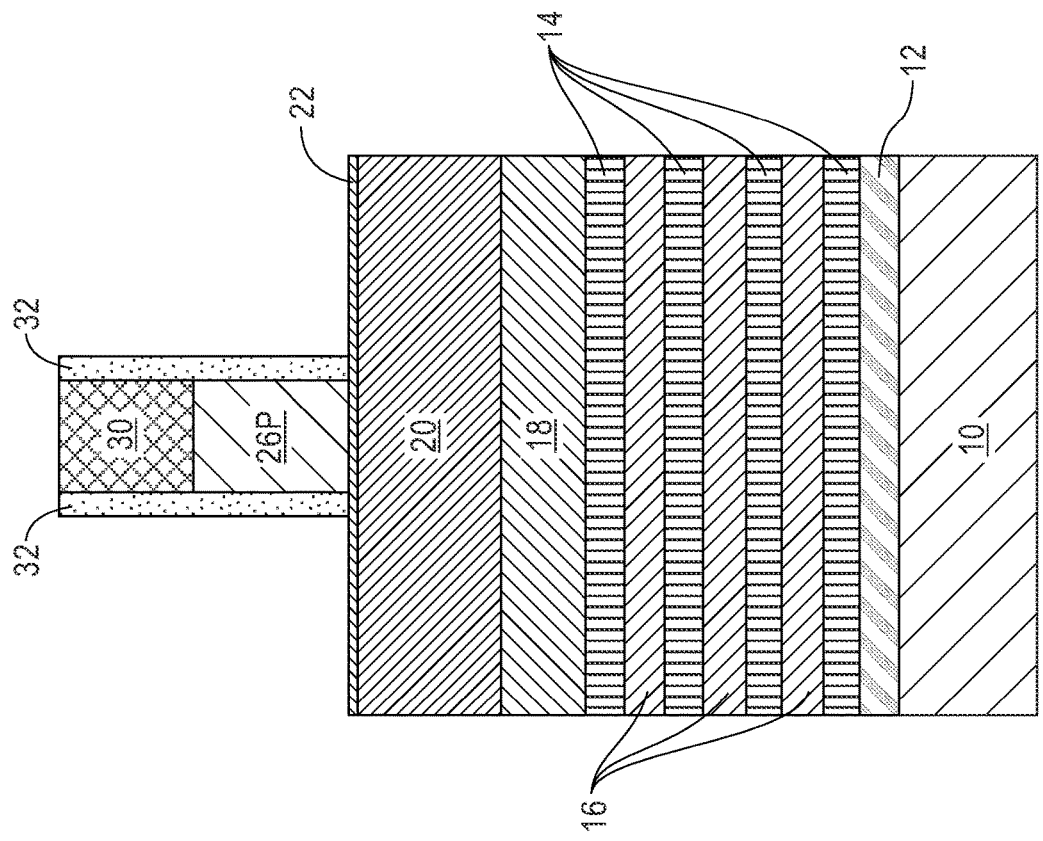
FIG. 7B is a cross sectional view of the exemplary semiconductor structure shown in FIG. 6B after forming a dielectric spacer along the physically exposed sidewall of the modified sacrificial gate material-containing pillar.

Referring now to FIGS. 7A, 7B and 7C, there are illustrated the exemplary semiconductor structure of FIGS. 6A, 6B and 6C, respectively, after forming a dielectric spacer 32 along the physically exposed sidewall of the modified sacrificial gate material-containing pillar 24T/26P. As is shown in FIG. 7C, a lower portion of the dielectric spacer 32 that is present laterally adjacent to the trimmed first sacrificial gate material portion 24T has a first thickness W3, while a middle portion of the dielectric spacer 32 that is present laterally adjacent to the second sacrificial gate material portion 26P has a second thickness W4; an upper portion of the dielectric spacer 32 is located laterally adjacent to the hard mask 30 and this upper portion of the dielectric spacer 32 has W4. In accordance with this embodiment of the present application, W3 is greater than W4.

The dielectric spacer 32 is composed of a dielectric spacer material such as, for example, silicon oxide, silicon nitride, or silicon oxynitride. In some embodiments, and as is illustrated in FIGS. 7B and 7C, the dielectric spacer 32 is pillar shaped and has a topmost surface that is coplanar with a topmost surface of the hard mask 30. The dielectric spacer 32 can be formed by deposition of the dielectric spacer material, followed by a spacer etch.

Figure 8A:
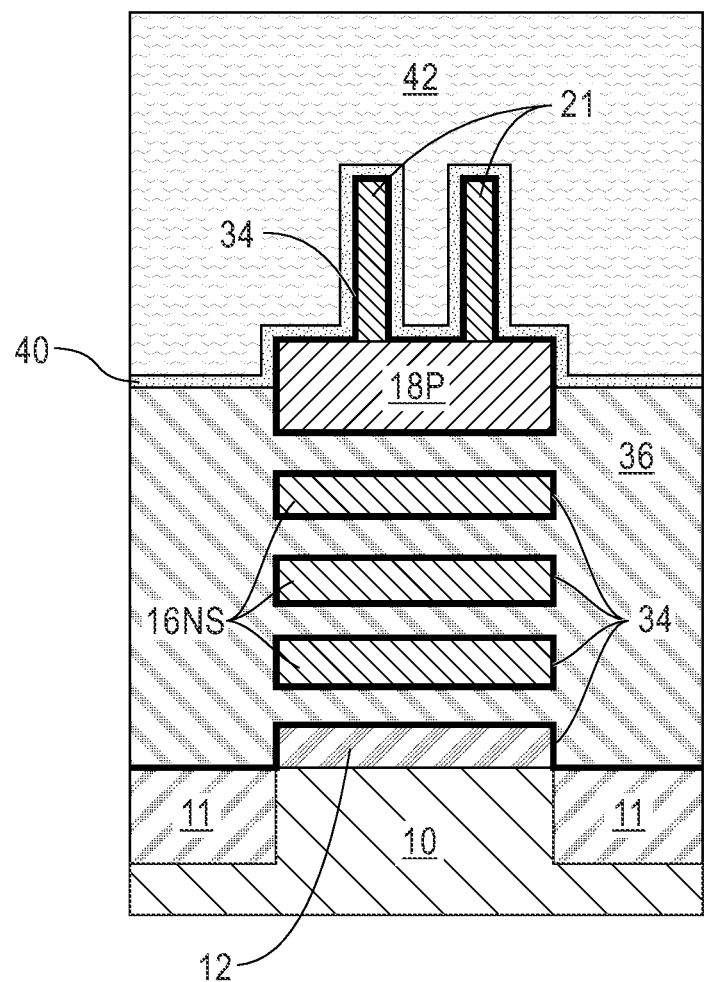
FIG. 8A is a cross sectional view of the exemplary semiconductor structure shown in FIG. 7A after further device processing including forming a semiconductor fin from each semiconductor channel material structure and a nanosheet stack containing alternating nanosheets of sacrificial semiconductor material and semiconductor channel material from the material stack, forming bottom and top source/drain regions, removing the modified sacrificial gate material-containing pillar and each nanosheet of sacrificial semiconductor material from the nanosheet stack, and forming a first functional gate structure having a first gate length in an area previously occupied by each recessed nanosheet of sacrificial semiconductor material and the remaining thinned portion of the recessed first sacrificial gate material layer, and forming a second functional gate structure having a second gate length that is greater than the first gate length in an area previously occupied by the remaining portion of the second sacrificial gate material layer.
Figure 8C:
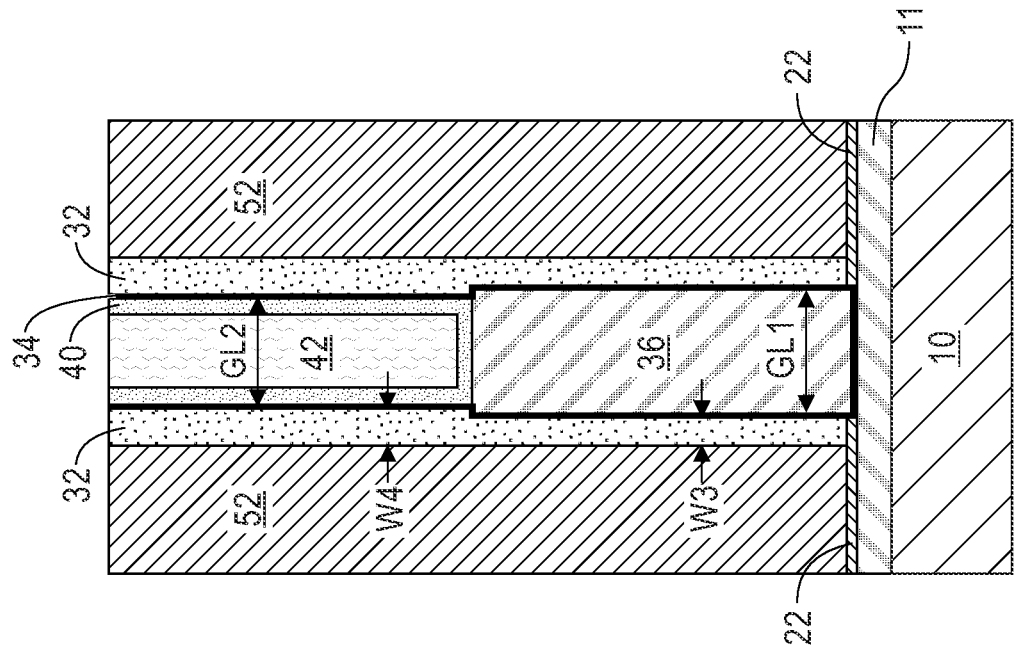
FIG. 8C is a cross sectional view of the exemplary semiconductor structure shown in FIG. 7C after further device processing including forming a semiconductor fin from each semiconductor channel material structure and a nanosheet stack containing alternating nanosheets of sacrificial semiconductor material and semiconductor channel material from the material stack, forming bottom and top source/drain regions, removing the modified sacrificial gate material-containing pillar and each nanosheet of sacrificial semiconductor material from the nanosheet stack, and forming a first functional gate structure having a first gate length in an area previously occupied by the remaining thinned portion of the recessed first sacrificial gate material layer, and forming a first functional gate structure having a first gate length in an area previously occupied by each recessed nanosheet of sacrificial semiconductor material and the remaining thinned portion of the recessed first sacrificial gate material layer, and forming a second functional gate structure having a second gate length that is greater than the first gate length in an area previously occupied by the remaining portion of the second sacrificial gate material layer.
Figure 8B:
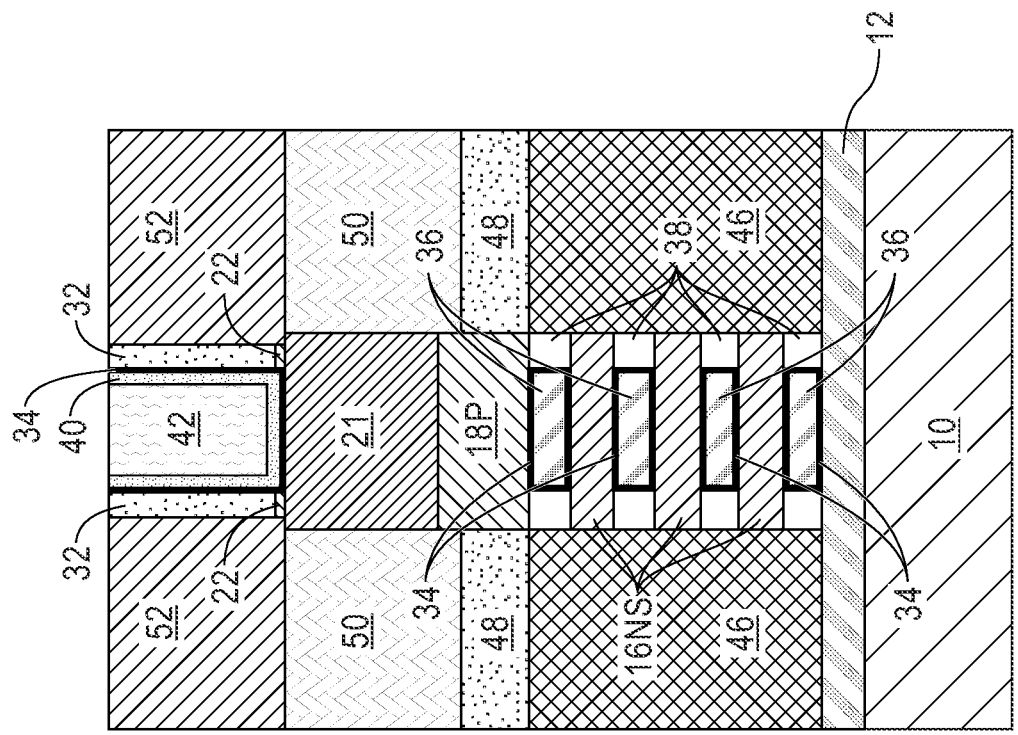
FIG. 8B is a cross sectional view of the exemplary semiconductor structure shown in FIG. 7B after further device processing including forming a semiconductor fin from each semiconductor channel material structure and a nanosheet stack containing alternating nanosheets of sacrificial semiconductor material and semiconductor channel material from the material stack, forming bottom and top source/drain regions, removing the modified sacrificial gate material-containing pillar and each nanosheet of sacrificial semiconductor material from the nanosheet stack, and forming a first functional gate structure having a first gate length in an area previously occupied by each recessed nanosheet of sacrificial semiconductor material and the remaining thinned portion of the recessed first sacrificial gate material layer, and forming a second functional gate structure having a second gate length that is greater than the first gate length in an area previously occupied by the remaining portion of the second sacrificial gate material layer.

Referring now to FIGS. 8A, 8B and 8C, there are illustrated the exemplary semiconductor structure shown in FIGS. 7A, 7B and 7C, respectively, after further device processing including forming a semiconductor fin 21 from each semiconductor channel material structure 20 and a nanosheet stack containing alternating nanosheets of sacrificial semiconductor material (not shown) and semiconductor channel materials 16NS from the material stack, MS1, forming bottom and top source/drain regions 46 and 50, respectively, removing the modified sacrificial gate material-containing pillar 24T/24P and each nanosheet of sacrificial semiconductor material from the nanosheet stack, and forming a first functional gate structure 34/36 having a first gate length in an area previously occupied by the recessed nanosheets of sacrificial semiconductor material as well as in the area previously occupied by the remaining thinned portion of the recessed first sacrificial gate material layer 24R (i.e., trimmed first sacrificial gate material portion 24T), and forming a second functional gate structure 34/40/42 having a second gate length that is greater than the first gate length in an area previously occupied by the remaining portion of the second sacrificial gate material layer 24L (i.e., second sacrificial material portion 26P).

As stated above, the further device processing includes forming at least one semiconductor fin 21 from each semiconductor channel material structure 20, and a nanosheet stack (not specifically shown) containing alternating nanosheets of sacrificial semiconductor material (not specifically shown) and semiconductor channel material 16NS from the material stack, MS1. Each semiconductor fin 21 includes a remaining portion of the semiconductor channel material structure 20. Within the nanosheet stack, each nanosheet of sacrificial semiconductor material includes a remaining portion of the layer of sacrificial semiconductor material 14, and each nanosheet of semiconductor channel material 16NS includes a remaining portion of the layer of a semiconductor channel material 16. The alternating nanosheets of sacrificial semiconductor material (not specifically shown) and semiconductor channel material 16NS that comprise the nanosheet stack have a reduced width as compared to the alternating layers of sacrificial semiconductor material 14 and semiconductor channel material 16 present in material stack, MS1. The height of the nanosheets of sacrificial semiconductor material (not specifically shown) and semiconductor channel material 16NS is the same as that of the alternating layers of sacrificial semiconductor material 14 and semiconductor channel material 16 present in material stack, MS1.

The at least one semiconductor fin 21 and the nanosheet stack are formed by removing portions of the semiconductor channel material structure 20, and portions of the material stack, MS1, that are not protected by the hard mask 30 capped sacrificial gate material-containing pillar 24T/26P and dielectric spacer 32. This removal process includes one or more etching processes. In addition to forming the least one semiconductor fin 21 and the nanosheet stack, this step which includes the one or more etching processes, also removes physically exposed portions of the top isolation layer 18 that are not protected the hard mask 30 capped sacrificial gate material-containing pillar 24T/26P and dielectric spacer 22. The remaining top isolation layer 18 can be referred to as a top isolation structure 18P. The step which includes the one or more etching processes stops on the bottom isolation layer 12, if present, or if the bottom isolation layer 12 is not present, on the trench isolation structure 11.

Each semiconductor fin 21 has a same height as the previous semiconductor channel material structure 20, and a width that is less than a width of the previous semiconductor channel material structure 20.

After forming the least one semiconductor fin 21 and the nanosheet stack, each nanosheet of sacrificial channel material is recessed utilizing a lateral recess etch process that selectively removes end portions of the nanosheet of sacrificial channel material relative to the nanosheets of semiconductor channel material 16NS; no recessing of the nanosheets of semiconductor channel material 16NS occurs. A gap is formed at the end of each of the recessed nanosheets sacrificial channel material. Inner dielectric spacer 38 is then formed into the gaps. Each inner dielectric spacer 38 includes one of the dielectric spacer materials mentioned above for dielectric spacer 32. The dielectric spacer material that provides each inner dielectric spacer 38 can be compositionally the same as, or compositionally different from, the dielectric spacer material that provides the dielectric spacer 32. Each inner dielectric spacer 38 can be formed by deposition of the dielectric spacer material, followed by a spacer etch. Each inner dielectric spacer 38 has an outermost sidewall that is vertically aligned to an outermost sidewall of each nanosheet of semiconductor channel material 16NS.

After forming inner dielectric spacers 38, a bottom source/drain region 46 is formed. As used herein, a "source/drain" region can be a source region or a drain region depending on subsequent wiring and application of voltages during operation of the FET. The bottom source/drain region 46 has a sidewall that is in directly physically contact with the outermost sidewalls of each nanosheet of semiconductor channel material 16NS. The bottom source/drain region 46 comprises a semiconductor material that is composed of a dopant. The semiconductor material that provides each bottom source/drain region 46 can include one of the semiconductor materials mentioned above for the semiconductor substrate 10. The semiconductor material that provides the bottom source/drain regions 46 can be compositionally the same, or compositionally different from each nanosheet of semiconductor channel material 16NS. The semiconductor material that provides the bottom source/drain regions 46 is however compositionally different from each recessed sacrificial nanosheet.

The dopant that is present in each bottom source/drain region 46 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each bottom source/drain region 46 can have a dopant concentration of from $4 \times 10^{20}$ atoms/cm$^3$ to $3 \times 10^{21}$ atoms/cm$^3$. In one example, each bottom source/drain region 46 is composed of phosphorus doped silicon.

Each bottom source/drain region 46 can be formed by an epitaxial growth in which the dopants are present during the epitaxial growth process. The bottom source/drain regions 46 grow laterally outward from each of the nanosheets of semiconductor channel material 16NS. A recess etch is then employed so as to remove the bottom source/drain region 46 from being located laterally adjacent both the top isolation structure 18P and the semiconductor fins 21.

Next, a source/drain isolation layer 48 is formed on each bottom source/drain region 46 and laterally adjacent to the top isolation structure 18P. The source/drain isolation layer 48 can include one of the dielectric materials mentioned above for the bottom isolation layer 12. The dielectric material that provides the source/drain isolation layer 48 can be compositionally the same as, or compositionally different from, the dielectric material that provides the bottom isolation layer 12 and/or the top isolation structure 18P.

A top source/drain region 50 is then formed on the source/drain isolation layer and laterally adjacent to the semiconductor fins 21. The top source/drain region 50 has a sidewall that is in directly physically contact with the outermost sidewalls of the semiconductor fins 21'. The top source/drain region 50 comprises a semiconductor material and a dopant that typically has a different conductivity than the dopant present in the bottom source/drain region 46. The semiconductor material that provides each top source/drain region 50 can include one of the semiconductor materials mentioned above for the semiconductor substrate 10. The semiconductor material that provides the top source/drain regions 50 can be compositionally the same, or compositionally different from the semiconductor fins 21. The dopant that is present in each top source/drain region 50 can be either a p-type dopant or an n-type dopant, as defined above. Again, the dopant present in the top source/drain region 50 typically has a different conductivity than the dopant present in the bottom source/drain region 48. In one example, each top source/drain region 50 is composed of boron doped silicon.

Each top source/drain region 50 can be formed by an epitaxial growth in which the dopants are present during the epitaxial growth process. The top source/drain region 50 grow laterally on physically exposed surface of the semiconductor fins 21. A recess etch can then be employed so as to remove the top source/drain region 50 from being located above the semiconductor fins 21.

An interlayer dielectric (ILD) material layer 52 is then formed atop the top source/drain regions 50 and above the semiconductor fins, 21. The ILD material layer 52 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 52 can include a multilayered structure that includes at least two different dielectric materials stacked one atop the other such as, for example, silicon nitride and silicon dioxide. The ILD material layer 52 can be formed by a deposition process such as, for example, CVD, PECVD, or spin-on coating. A planarization process can be performed after the deposition of the dielectric material that provides the ILD material layer 52. The planarization process can remove the hard mask cap 30 from the structure.

After forming the ILD material layer 52, the modified sacrificial gate material-containing pillar 24T/26P is removed from the structure. The removal of the modified sacrificial gate material-containing pillar 24T/26P is performed utilizing one or more etching processes that is selective in removing the modified sacrificial gate material-containing pillar 24T/26P from the structure. The removal of the modified sacrificial gate material-containing pillar 24T/26P provides a cavity that physically exposed the recessed nanosheets of sacrificial semiconductor material. Each recessed nanosheet of sacrificial semiconductor material is then removed utilizing an etching process that selectively removes the semiconductor material that provides the nanosheets of sacrificial semiconductor material relative to the nanosheets of semiconductor channel material 16NS and the semiconductor fins 21. In one example, and when the nanosheets of sacrificial semiconductor material are composed of silicon germanium, and the nanosheets of semiconductor channel material 16NS and the semiconductor fins 21 are both composed of silicon, the selective etch includes vapor HCl.

After removing each recessed nanosheet of sacrificial semiconductor material, each nanosheet semiconductor channel material 16NS is now vertically stack, spaced apart from each other and suspended above the semiconductor substrate 10. Each nanosheet of semiconductor channel material 16NS serves as an active channel material of nanosheet FET device, while each semiconductor fin 21 serves as an active channel material of a FinFET device.

Next a first (or lower) functional gate structure 34/36 having a first gate length, GL1, is formed in an area previously occupied by the recessed nanosheets of sacrificial semiconductor material and the remaining thinned portion of the recessed first sacrificial gate material layer 24R (i.e., trimmed first sacrificial gate material portion 24T). The first functional gate structure 34/36 is formed around each nanosheet of semiconductor channel material 16NS. The first functional gate structure 34/36 includes a first gate dielectric material layer 34 and a first gate electrode 36.

The first gate dielectric material layer 34 is composed of a first gate dielectric material. The first gate dielectric material that provides the first gate dielectric material layer 34 includes, but is not limited to, silicon oxide, silicon nitride, silicon oxynitride, high-k materials (i.e., dielectric materials having a dielectric constant of greater than 4.0) or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric may further include dopants such as lanthanum, aluminum, magnesium. The first gate dielectric material that provides the first gate dielectric material layer 34 can be formed by a deposition process including, but not limited to CVD, PECVD, or atomic layer deposition (ALD). In some embodiments, the first gate dielectric material layer 34 has a thickness ranging from 1 nm to 5 nm, although less thickness and greater thickness are also envisioned.

The first gate electrode 36 is composed of a first conductive material. The first conductive material that provides the first gate electrode 36 includes, but is not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, or any suitable combination of these materials. The first conductive material may further comprise dopants that are incorporated during or after deposition.

In some embodiments, the first functional gate structure can include a first work function setting layer (not shown) between the first gate dielectric material layer 34 and the gate electrode 36. The first work function setting layer can be composed of a first work function metal (WFM). The first WFM can be any suitable material including, but not limited to, a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a first conductive material or a combination of multiple first conductive materials can serve as both gate electrode 36 and the first work function setting layer. The first gate conductor material and, if present, the first WFM can be formed by any suitable process or any suitable combination of multiple processes, including but not limited to, ALD, CVD, PECVD, PVD, sputtering, or plating.

The first functional gate structure is formed by depositing a blanket layer of the first gate dielectric material, optionally a blanket layer of the first WFM, and then a layer of the first conductive material is formed. A planarization process is then performed to remove the first gate dielectric material, if, present the blanket layer of the first WFM, and the layer of the first conductive material that is formed on a topmost surface of the ILD material layer 52. A recess etch is then used to reduce the height of at least the remaining layer of the first conductive material; the recess etch may also reduce the height of the first WFM.

As is shown in FIG. 8A, the first gate dielectric layer 34 is formed around each of the semiconductor fins 21, around portions of the top isolation structure 18P not covered by the semiconductor fins 21, around each nanosheet of semiconductor channel material 14NS, and on physically exposed surfaces of the bottom isolation structure 12 and the trench isolation structure 11.

Next, a second functional gate structure 34/40/42 having a second gate length, GL2, that is greater than the first gate length, GL1, is formed in an area previously occupied by the remaining portion of the second sacrificial gate material layer 24L (i.e., second sacrificial material portion 26P). The second functional gate structure includes an upper portion of the first gate dielectric material layer 34, a second gate dielectric material layer 40, and a second gate electrode 42. In some embodiments, a second work function setting layer can be present between the second gate dielectric material layer 40 and the second gate electrode 42.

The second gate dielectric material layer 40 includes a second gate dielectric material. The second gate dielectric material that provides the second gate dielectric material layer 40 includes one of the first gate dielectric materials mentioned above for the first gate dielectric material layer 34. The second gate dielectric material that provides the second gate dielectric material layer 40 can be compositionally the same as, or compositionally different from, the first gate dielectric material that provides the first gate dielectric material layer 34. The second gate dielectric material that provides the second gate dielectric material layer 40 can be formed using one of the deposition processes mentioned above for forming the first gate dielectric that provides the first gate dielectric material layer 34. The second gate dielectric material layer 40 can have a thickness within thickness range mentioned above for the first gate dielectric material layer 34.

The second gate electrode 42 includes a second conductive material. The second conductive material that provides the second gate electrode 42 includes one of the first conductive materials mentioned above for the first gate electrode 36. The conductive material that provides the second gate electrode 42 can be compositionally the same as, or compositionally different from, the first conductive material that provides the first gate electrode 42. The second conductive material that provides the second gate electrode can be formed using one of the deposition processes mentioned above for forming the first conductive material that provides the first gate electrode 36.

A second work function setting layer that can be optionally present includes a second WFM material. The second WFM includes one of the materials mentioned above for the first WFM. The second WFM is typically compositionally different from the first WFM.

The second functional gate structure is formed by depositing a blanket layer of the second gate dielectric material, optionally a blanket layer of the second WFM, and then a layer of the second conductive material is formed. A planarization process is then performed to remove the second gate dielectric material, if, present the blanket layer of the second WFM, and the layer of the second conductive material that is formed on a topmost surface of the ILD material layer 52.

As is shown in FIG. 8A, the second gate dielectric layer 40 is formed on the first gate dielectric material layer that is formed around each of the semiconductor fins 21. The second gate dielectric layer 40 extends onto a topmost surface of the first gate electrode 36.

In FIGS. 8A, 8B, and 8C, the second functional gate structure 34/40/42 that is formed on the semiconductor fins 21 can be referred to as a FinFET, while the first functional gate structure 34/36 that is formed in a wrap-around fashion about the vertical nanosheet stack of semiconductor channel material 16NS can be referred to as a nanosheet FET. Thus, and in this embodiment, the nanosheet FET has a gate length that is less than a gate length of the FinFET that is vertically stacked above the nanosheet FET.

Figure 9A:
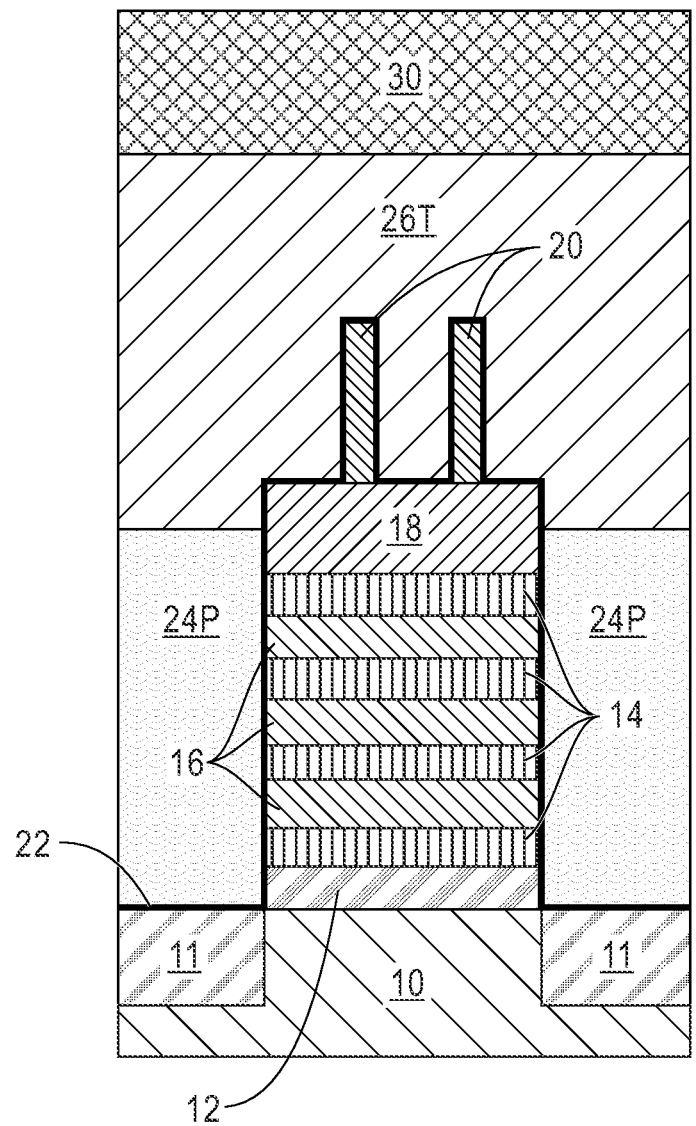
FIG. 9A is a cross sectional view of the exemplary semiconductor structure shown in FIG. 5A after thinning the remaining portion of the second sacrificial gate material layer to provide a modified sacrificial gate material-containing pillar containing the thinned remaining portion of the second sacrificial gate material layer and the remaining portion of the recessed first sacrificial gate material layer.
Figure 9C:
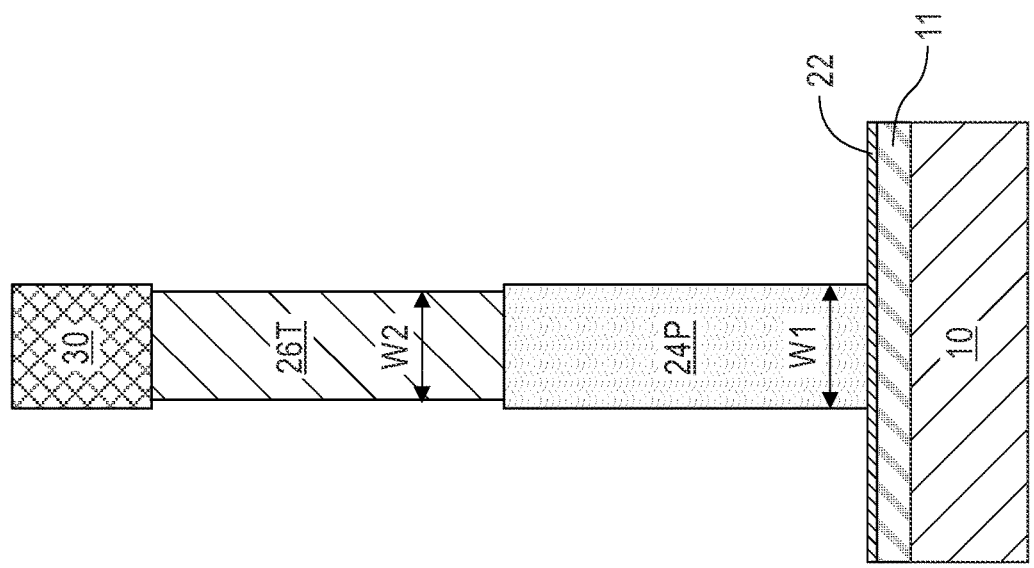
FIG. 9C is a cross sectional view of the exemplary semiconductor structure shown in FIG. 5C after thinning the remaining portion of the second sacrificial gate material to provide a modified sacrificial gate material-containing pillar containing the thinned remaining portion of the second sacrificial gate material layer and the remaining portion of the recessed first sacrificial gate material layer.
Figure 9B:
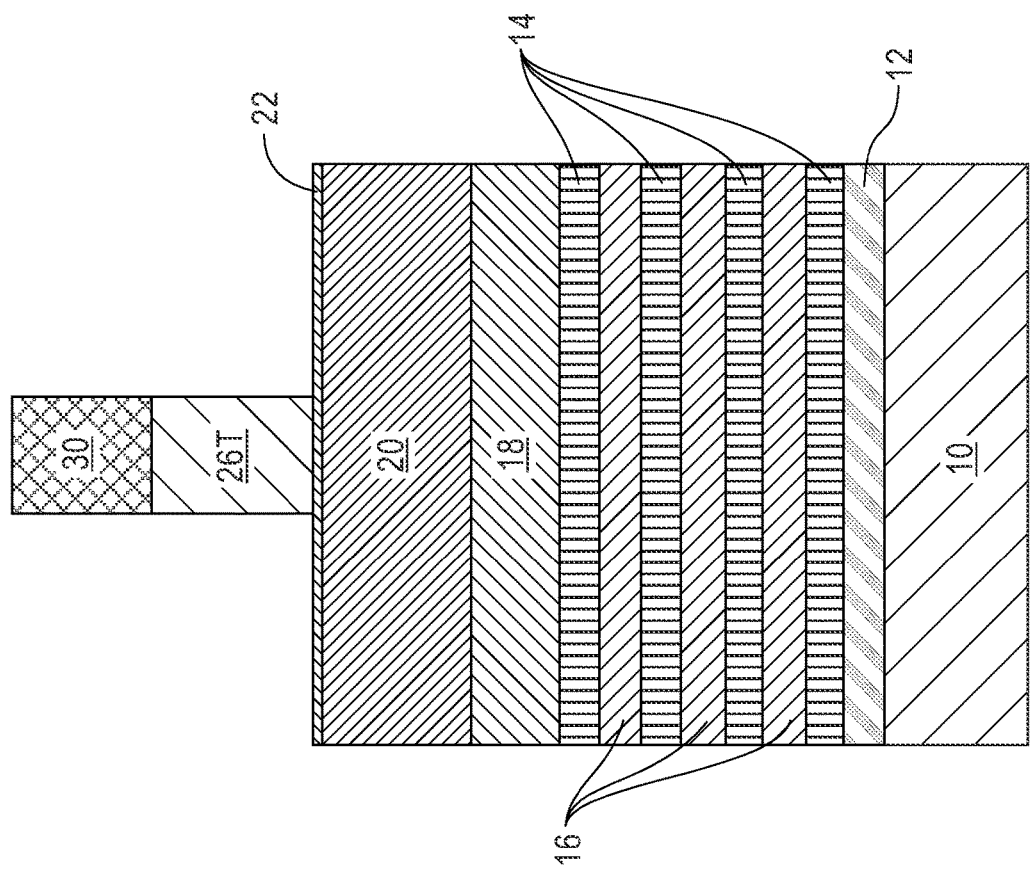
FIG. 9B is a cross sectional view of the exemplary semiconductor structure shown in FIG. 5B after thinning the remaining portion of the second sacrificial gate material layer to provide a modified sacrificial gate material-containing pillar containing the thinned remaining portion of the second sacrificial gate material layer and the remaining portion of the recessed first sacrificial gate material layer.

Referring now to FIGS. 9A, 9B, 9C, there is illustrated the exemplary semiconductor structure of FIGS. 5A, 5B and 5C, respectively, after thinning the remaining portion of the second sacrificial gate material layer 26L (i.e., second sacrificial material portion 26P) to provide a modified sacrificial gate material-containing pillar 24P/26T containing the thinned remaining portion of the second sacrificial gate material layer 26L (i.e., thinned second sacrificial gate material portion 26T) and the remaining portion of the recessed first sacrificial gate material layer 24R (i.e., recessed first sacrificial material portion 24P).

The remaining thinned portion of the second sacrificial gate material layer (i.e., the second sacrificial gate material portion 26P) can be referred herein as a trimmed second sacrificial gate material portion 26T. As is shown in FIG. 9C, the recessed first sacrificial material portion 24P has first has a first width, W1, and the trimmed second sacrificial gate material portion 26T has a second width, W2. In accordance with this embodiment of the present application W1 is greater less than W2. In one example, W1 is from 12 nm to 200 nm, while W2 is from 10 nm to 200 nm.

This thinning step includes a trimming process such as, an etch, that is selective in removing the second sacrificial gate material as compared to the first sacrificial gate material. In one example, the etch includes a chemical wet etching process.

Figure 10A:
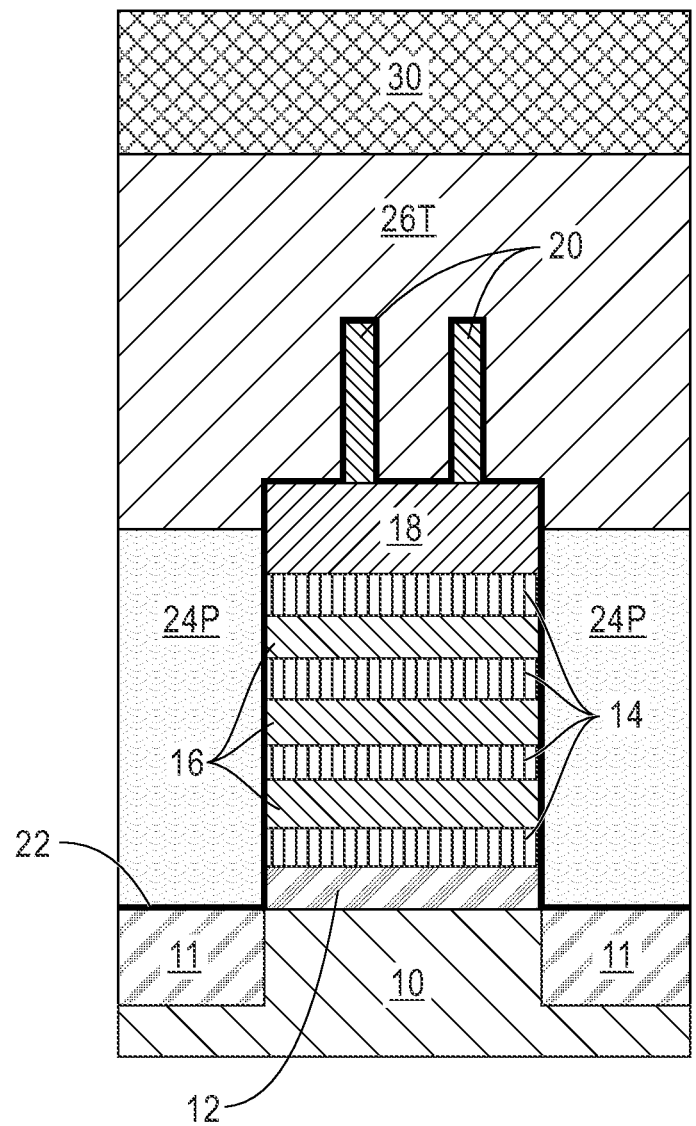
FIG. 10A is a cross sectional view of the exemplary semiconductor structure shown in FIG. 9A after forming a dielectric spacer along the physically exposed sidewall of the modified sacrificial gate material-containing pillar.
Figure 10C:
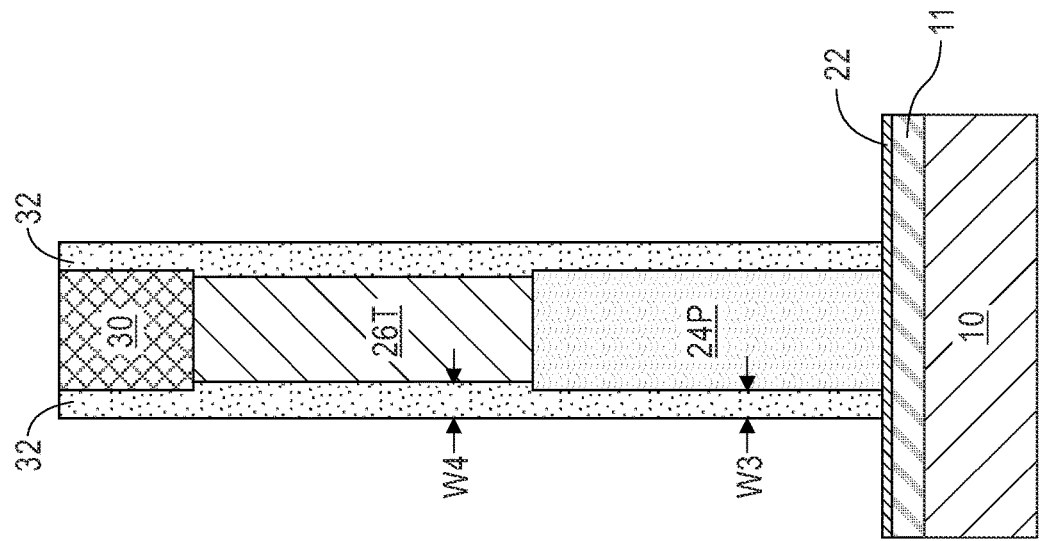
FIG. 10C is a cross sectional view of the exemplary semiconductor structure shown in FIG. 9C after forming a dielectric spacer along the physically exposed sidewall of the modified sacrificial gate material-containing pillar.
Figure 10B:
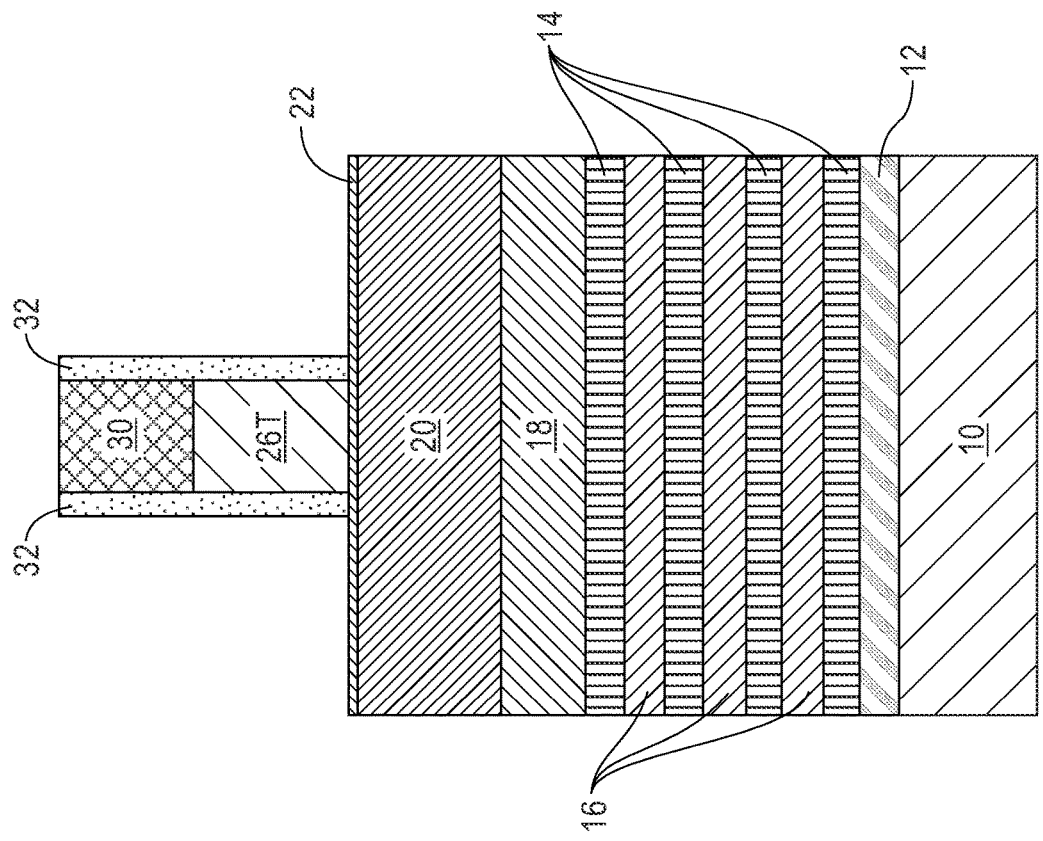
FIG. 10B is a cross sectional view of the exemplary semiconductor structure shown in FIG. 9B after forming a dielectric spacer along the physically exposed sidewall of the modified sacrificial gate material-containing pillar.

Referring now to FIGS. 10A, 10B and 10C, there are illustrated the exemplary semiconductor structure of FIGS. 9A, 9B and 9C, respectively, after forming a dielectric spacer 32 along the physically exposed sidewall of the modified sacrificial gate material-containing pillar 24P/26T. Dielectric spacer 32 that is used in this embodiment of the present application includes the same dielectric spacer material as mentioned above for dielectric spacer 32 in the previous embodiment of the present application. Dielectric spacer 32 can be formed utilizing the processes techniques mentioned above for forming the dielectric spacer 32 in the previous embodiment of the present application.

As is shown in FIG. 10C, a lower portion of the dielectric spacer 32 that is present laterally adjacent to the sacrificial gate material portion 24P has a first thickness W3, while a middle portion of the dielectric spacer 32 that is present laterally adjacent to the trimmed second sacrificial gate material portion 26T has a second thickness W4; an upper portion of the dielectric spacer 32 is located laterally adjacent to the hard mask 30 and has thickness W4. In accordance with this embodiment of the present application, W3 is less than W4.

Figure 11A:
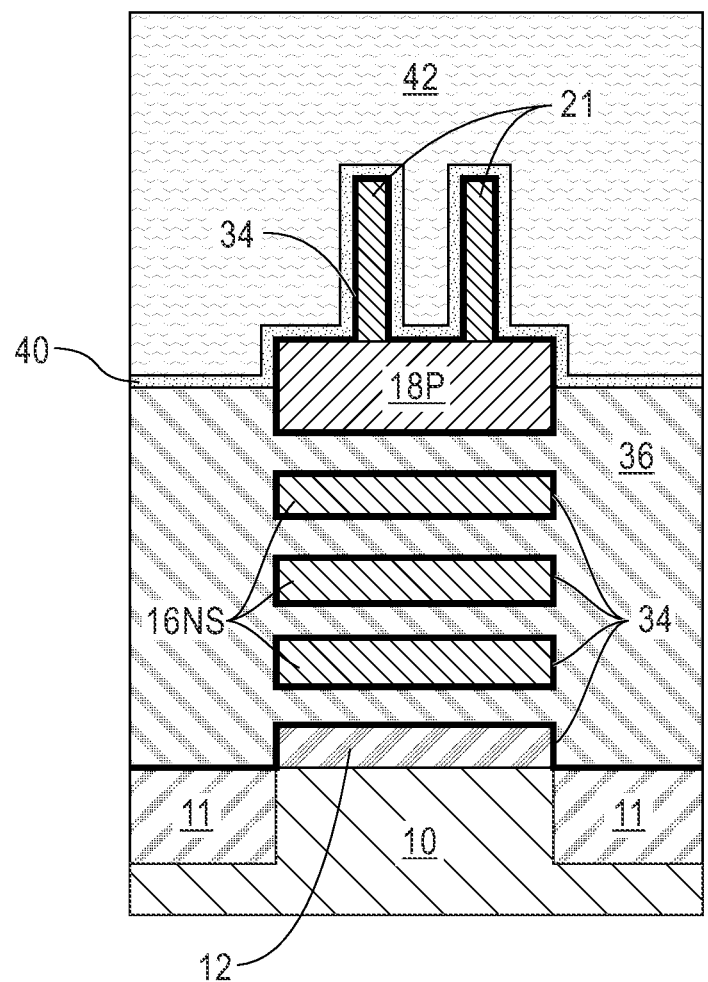
FIG. 11A is a cross sectional view of the exemplary semiconductor structure shown in FIG. 10A after further device processing including forming a semiconductor fin from each semiconductor channel material structure and a nanosheet stack containing alternating nanosheets of sacrificial semiconductor material and semiconductor channel materials from the material stack, forming bottom and top source/drain regions, removing the modified sacrificial gate material-containing pillar and each nanosheet of sacrificial semiconductor material from the nanosheet stack, and forming a first functional gate structure having a first gate length in an area previously occupied by the recessed nanosheets of sacrificial semiconductor material and the remaining portion of the recessed first sacrificial gate material layer, and forming a second functional gate structure having a second gate length that is less than the first gate length in an area previously occupied by the remaining thinned portion of the second sacrificial gate material layer.

Referring now to FIGS. 11A, 11B and 11C, there are illustrated the exemplary semiconductor structure of FIGS. 10A, 10B, and 10C, respectively, after further device processing including forming a semiconductor fin 21 from each semiconductor channel material structure 20 and a nanosheet stack containing alternating nanosheets of sacrificial semiconductor material (not shown) and semiconductor channel material 16NS from the material stack, MS1, forming bottom and top source/drain regions 46 and 50, respectively, removing the modified sacrificial gate material-containing pillar 24P/26T and each nanosheet of sacrificial semiconductor material from the nanosheet stack, and forming a first functional gate structure 34/36 having a first gate length, GL1, in an area previously occupied by the recessed nanosheets of sacrificial semiconductor material and the remaining portion of the recessed first sacrificial gate material layer 24L (i.e., the first sacrificial gate material portion 24P), and forming a second functional gate structure 34/40/42 having a second gate length, GL2, that is less than the first gate length, GL1, in an area previously occupied by the remaining thinned portion of the second sacrificial gate material layer 26L (i.e., trimmed second gate material portion 26T).

The processing steps and materials mentioned above in forming the exemplary structure shown in FIGS. 8A, 8B and 8C are used here in providing the structure shown in FIGS. 11A, 11B and 11C.

In FIGS. 11A, 11B, and 11C, the second functional gate structure 34/40/42 that is formed on the semiconductor fins 21 can be referred to as a FinFET, while the first functional gate structure 34/36 that is formed in a wrap-around fashion about the vertical nanosheet stack of semiconductor channel material 16NS can be referred to as a nanosheet FET. Thus, and in this embodiment, the nanosheet FET has a gate length that is greater than a gate length of the FinFET that is vertically stacked above the nanosheet FET.

Figure 12:
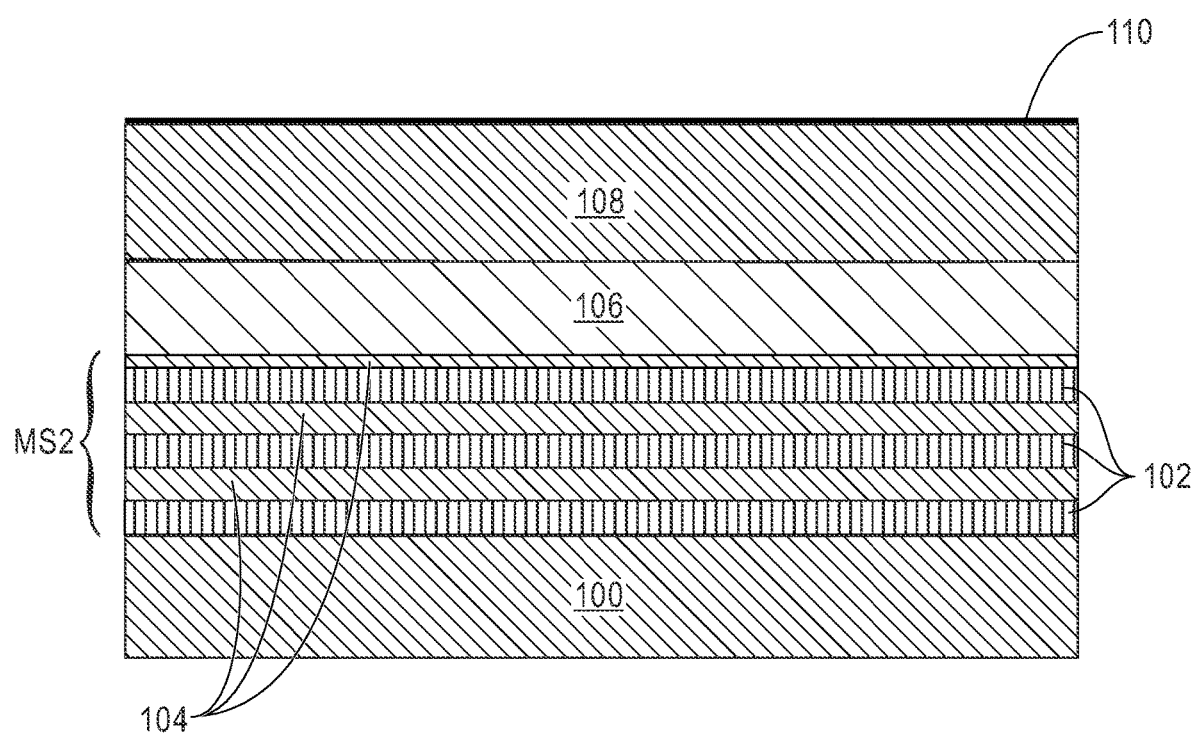
FIG. 12 is a cross sectional view of an exemplary semiconductor structure that can be employed in accordance with another embodiment of the present application, the exemplary semiconductor structure including a semiconductor substrate, a material stack of alternating layers of sacrificial semiconductor material and semiconductor channel material, a first isolation layer, a semiconductor material layer, and a second isolation layer.

Reference will now be made to FIGS. 12-21 which illustrate another embodiment of the present application. In this embodiment of present application which is exemplified in FIGS. 12-21, a flow over-flow method will be described and illustrated. Referring first to FIG. 12, there is illustrated an exemplary semiconductor structure that can be employed in accordance with this flow over-flow method. The exemplary semiconductor structure of FIG. 12 includes a semiconductor substrate 100, a material stack, MS2, of alternating layers of sacrificial semiconductor material 102 and a semiconductor channel material 104, a first isolation layer 106, a semiconductor material layer 108, and a second isolation layer 110.

The semiconductor substrate 100 of this embodiment of the present application includes at least one of the semiconductor materials mentioned above for semiconductor substrate 10. In some embodiments, the semiconductor substrate 100 can be a bulk semiconductor substrate, as described above in regard to semiconductor substrate 10. In other embodiments, the semiconductor substrate 100 can be a semiconductor-on-insulator substrate, as described above in regard to semiconductor substrate 10.

As mentioned above, the material stack, MS2, includes alternating layers of sacrificial semiconductor material 102 and semiconductor channel material 104. Each layer of sacrificial semiconductor material 102 within the material stack, MS2, can be referred to as a "sacrificial semiconductor material layer", and each layer of semiconductor channel material 104 can be referred to as a "semiconductor channel material layer". In this embodiment, the number of layers of semiconductor channel material 104 match the number of layers of sacrificial semiconductor material 102. The number of layers of sacrificial semiconductor material 102 and the number of layers of semiconductor channel material 104 within the material stack, MS2, can vary. By way of one example, the illustrated material stack, MS2, includes three layers of sacrificial semiconductor material 102, and three layers of semiconductor channel material 104.

Each layer of sacrificial semiconductor material 102 is composed of a first semiconductor material, while each layer of semiconductor channel material 104 is composed of a second semiconductor material that is compositionally different from the first semiconductor material. In some embodiments, the second semiconductor material that provides each layer of semiconductor channel material 104 is a semiconductor material that is capable of providing high channel mobility for n-type FET devices. In other embodiments, the second semiconductor material that provides each layer of semiconductor channel material 104 is a semiconductor material that is capable of providing high channel mobility for p-type FET devices.

The first semiconductor material that provides each layer of sacrificial semiconductor material 102 and the second semiconductor material that provides each layer of semiconductor channel material 104 can include one of the semiconductor materials mentioned above for semiconductor substrate 10. In the present application, the first semiconductor material that provides each layer of sacrificial semiconductor material 102 can be compositionally the same as, or compositionally different from, at least an uppermost semiconductor material portion of the semiconductor substrate 100. Typically, the first semiconductor material that provides each layer of sacrificial semiconductor material 102 is compositionally different from at least the uppermost semiconductor material portion of the semiconductor substrate 100. The second semiconductor material that provides each layer of semiconductor channel material 104 can be compositionally the same as, or compositionally different from, at least an uppermost semiconductor material portion of the semiconductor substrate 100. Typically, the second semiconductor material that provides each layer of semiconductor channel material 104 is compositionally the same as at least the uppermost semiconductor material portion of the semiconductor substrate 110. In one example, the semiconductor substrate 110 is composed silicon, the first semiconductor material that provides each layer of sacrificial semiconductor material 102 is composed of a silicon germanium alloy, and the second semiconductor material that provides each layer of semiconductor channel material 104 is composed of silicon. Other combinations of semiconductor materials are possible as long as the first semiconductor material that provides each layer of sacrificial semiconductor material 102 is compositionally different from the second semiconductor material that provides each layer of semiconductor channel material 104.

The thickness (i.e., height) of each layer of sacrificial semiconductor material 102 can be the same or different from the thickness of each layer of semiconductor channel material 104. A typical thickness for each layer of sacrificial semiconductor material 102 and each layer of semiconductor channel material 104 is from 2 nm to 10 nm. Other thicknesses are contemplated and can be used as the widths of each layer of sacrificial semiconductor material 102 and each layer of semiconductor channel material 104.

The material stack, MS2, including the alternating layers of sacrificial semiconductor material 102 and semiconductor channel material 104 can be formed by an epitaxially growth process Epitaxial semiconductor material layers can be grown from gaseous or liquid precursors, and may be grown using vapor-phase epitaxy (VPE), molecular-beam epitaxy (MBE), liquid-phase epitaxy (LPE), or other suitable process. In some embodiments, epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of FET being formed.

The first isolation layer 106 is then formed on the topmost surface of the material stack, MS2. The first isolation layer 106 is composed of a dielectric material such as, for example, silicon dioxide, silicon nitride, silicon oxynitride, or any suitable combination of those dielectric materials. The first isolation layer 106 can have a thickness from 10 nm to 200 nm; although other thickness for the first isolation layer 106 are contemplated and can be used in the present application as the thickness of the first isolation layer 106. The first isolation layer 106 can be formed by a deposition process including, but not limited to, CVD, PECVD or PVD.

The semiconductor material layer 108 is then formed on the topmost surface of the first isolation layer 106. The semiconductor material layer 108 is composed of one of the semiconductor materials mentioned above for the semiconductor substrate 10. The semiconductor material that provides the semiconductor material layer 108 can be compositionally the same as, or compositionally different from, at least an uppermost semiconductor material of semiconductor substrate 100. The semiconductor material that provides the semiconductor material layer 108 can be selected to provide high channel mobility for n-type FET devices, or high channel mobility for p-type FET devices.

The semiconductor material layer 108 can have a thickness from 10 nm to 100 nm. Although other thicknesses are contemplated and can be use as the thickness of the semiconductor material layer 108. The semiconductor material layer 108 can be formed by deposition such as, for example, an epitaxial growth process.

The second isolation layer 110 is then formed on the topmost surface semiconductor material layer 108. The second isolation layer 110, which can be referred to as a sacrificial gate dielectric material layer, is composed one or the dielectric materials mentioned above for the first isolation layer 106. The dielectric material that provides the second isolation layer 110 can be compositionally the same as, or compositionally different from, the dielectric material that provides the first isolation layer 106. The second isolation layer 110 can be formed by a deposition process including, but not limited to, CVD, PECVD or PVD.

Figure 13:
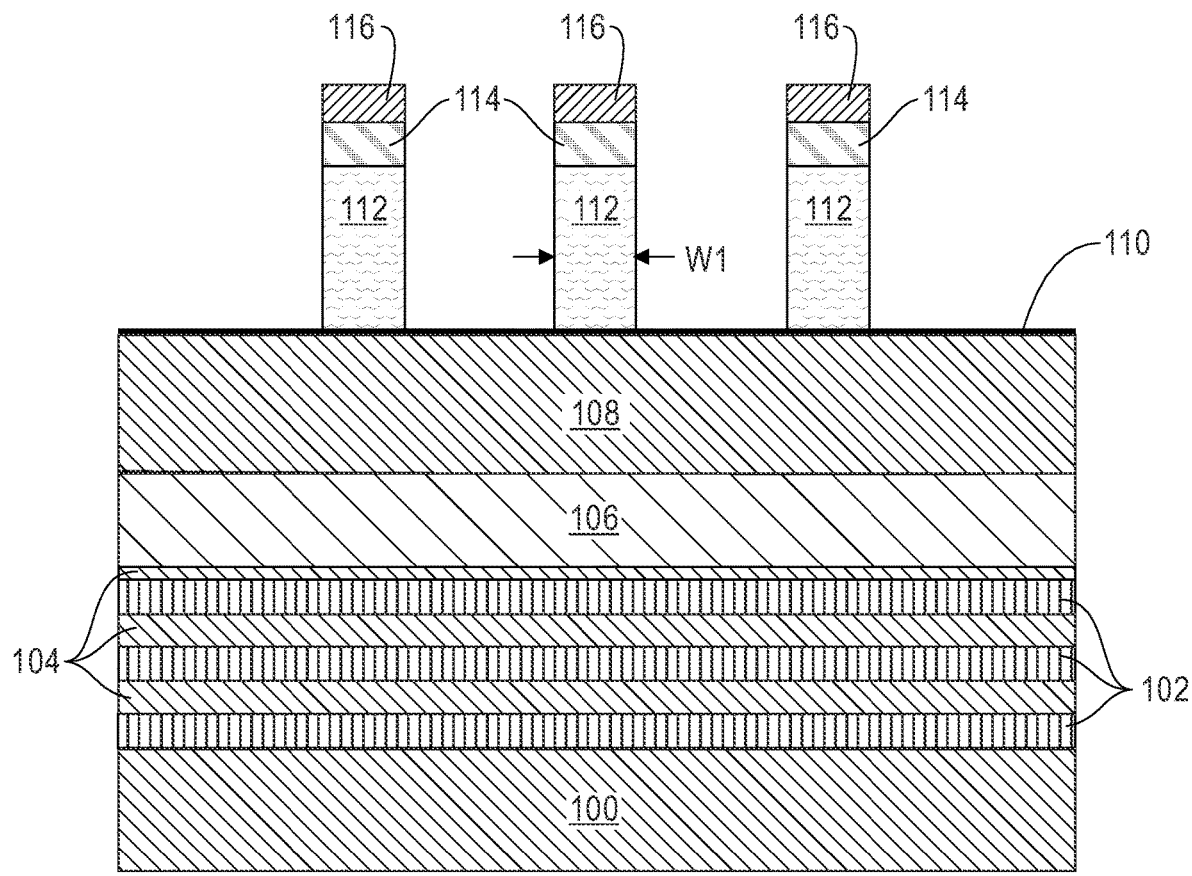
FIG. 13 is a cross sectional view of the exemplary semiconductor structure of FIG. 12 after forming first sacrificial gate structures having a first width on a topmost surface of the second isolation layer.

Referring now to FIG. 13, there is illustrated the exemplary semiconductor structure of FIG. 12 after forming first sacrificial gate structures 112/114/116 having a first width, W1, on a topmost surface of the second isolation layer 110. Although FIG. 13 illustrates the formation of three first sacrificial gate structures 112/114/116, the present application is not limited to that number of first sacrificial gate structures 112/114/116. Instead, the present application contemplates embodiments in which at least one first sacrificial gate structure 112/114/116 is formed.

Each first sacrificial gate structure includes at least a sacrificial gate material 112. The sacrificial gate material 112 can be composed one of the first sacrificial gate materials mentioned above for the first sacrificial gate material layer 24L. That is, sacrificial gate material 112 can include, but is not limited to, polysilicon, amorphous silicon, amorphous silicon germanium, tungsten, titanium, tantalum, aluminum, nickel, ruthenium, palladium, platinum, or alloys of such metals. The thickness of each sacrificial gate material is within the range mentioned above for the first sacrificial gate material layer 24L.

Each first sacrificial gate structure can at least one hard mask. In the illustrated embodiment, each first sacrificial gate structure optionally includes a first hard mask 114 and a second hard mask 116. The first hard mask 114 can be composed of a first hard mask material, while the second hard mask 116 can be composed of a second hard mask material that is compositionally different from the first hard mask material. In one embodiment, the first hard mask 114 is composed of silicon nitride, while the second hard mask 116 can be composed of silicon dioxide. Each of the first and second hard masks 114, 116 can have a thickness from 20 nm to 100 nm; although other thicknesses for the first and second hard masks 114, 116 are contemplated and can be employed in the present application.

Each first sacrificial gate structure can be formed by depositing blanket layers of sacrificial gate material and hard mask materials and then the resultant blanket multilayered material stack is patterned by lithography and etching.

Figure 14:
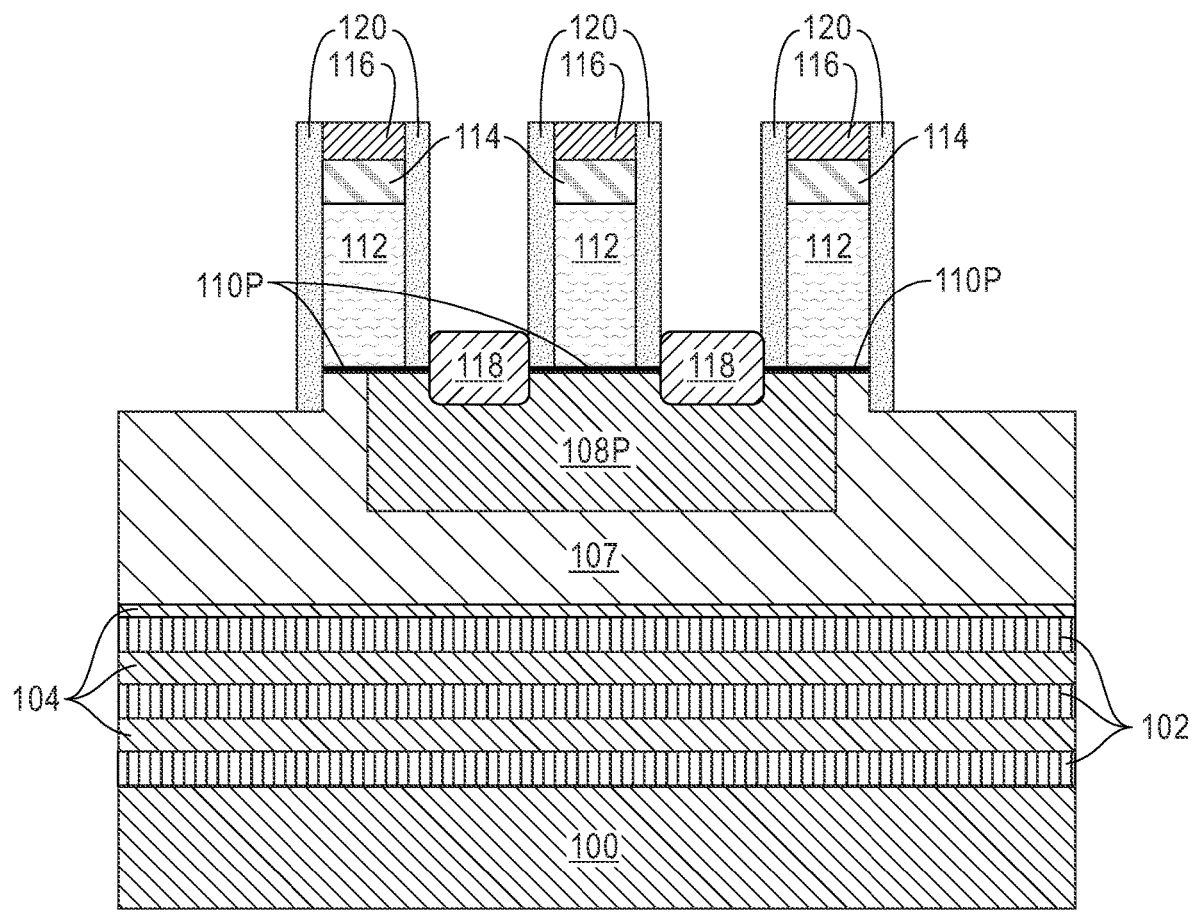
FIG. 14 is a cross sectional view of the exemplary semiconductor structure of FIG. 13 after forming first dielectric spacers, first source/drain regions, patterning the semiconductor material layer to provide a semiconductor fin, and forming additional dielectric material.

Referring now to FIG. 14, there is illustrated the exemplary semiconductor structure of FIG. 13 after forming first dielectric spacers 120, first source/drain regions 118, patterning the semiconductor material layer 108 to provide a semiconductor fin 108P, and forming additional dielectric material.

The first dielectric spacers 120 are formed along a sidewall of each first sacrificial gate structure 112/114/116. The first dielectric spacers 120 can include one of the dielectric spacer materials mentioned above for dielectric spacer 32. The first dielectric spacers 120 can be formed by depositing the dielectric spacer material, followed by a spacer etch. Each first dielectric spacer 120 can be pillar shaped as is shown in FIG. 14.

After forming the first dielectric spacers 120, the physically exposed portions of the second insulator layer 110 are removed utilizing an etching process and the dielectric spacers 120 and the first sacrificial gate structures 112/114/116 as a combined etch mask. The etching process used to remove physically exposed portions of the second insulator layer 110 can include a dry etching process such as, for example, a reactive ion etch. The second insulator layer 110 remains under the dielectric spacers 120 and the first sacrificial gate structures 112/114/116. The remaining second insulator layer 110 can be referred to as a second insulator portion 110P.

First source/drain regions 118 are then formed. The first source/drain regions 118 include a semiconductor material and a dopant as defined above for the bottom source/drain regions 46. The first source/drain regions 118 can be formed by an epitaxial growth process in which the dopants can be added during the epitaxial growth process or after the epitaxial growth process. The first source/drain regions 118 can be formed into a trench that is formed into the semiconductor material layer 108 prior to the epitaxial growth process. In other embodiments, the first source/drain regions 118 can be formed by introducing a p-type or n-type dopant into the semiconductor material layer 108.

The semiconduction material layer 108 is then patterned by lithography and etching to provide semiconductor fin 108P which contains the first source/drain regions 118. In some embodiments, the patterning of the semiconduction material layer 108 can occur prior to source/drain formation, yet after forming the first dielectric spacers 120.

Additional dielectric material is then formed. In the present application, the additional dielectric material is a same dielectric material as the first insulator layer 106 thus collectively the additional dielectric layer and the first insulator layer 106 provide an insulator structure 107. The additional dielectric material can be formed utilizing one of the deposition processes mentioned above for forming the first insulator layer 106. In some embodiments, a recess etch can follow the deposition of the additional dielectric material.

Figure 15:
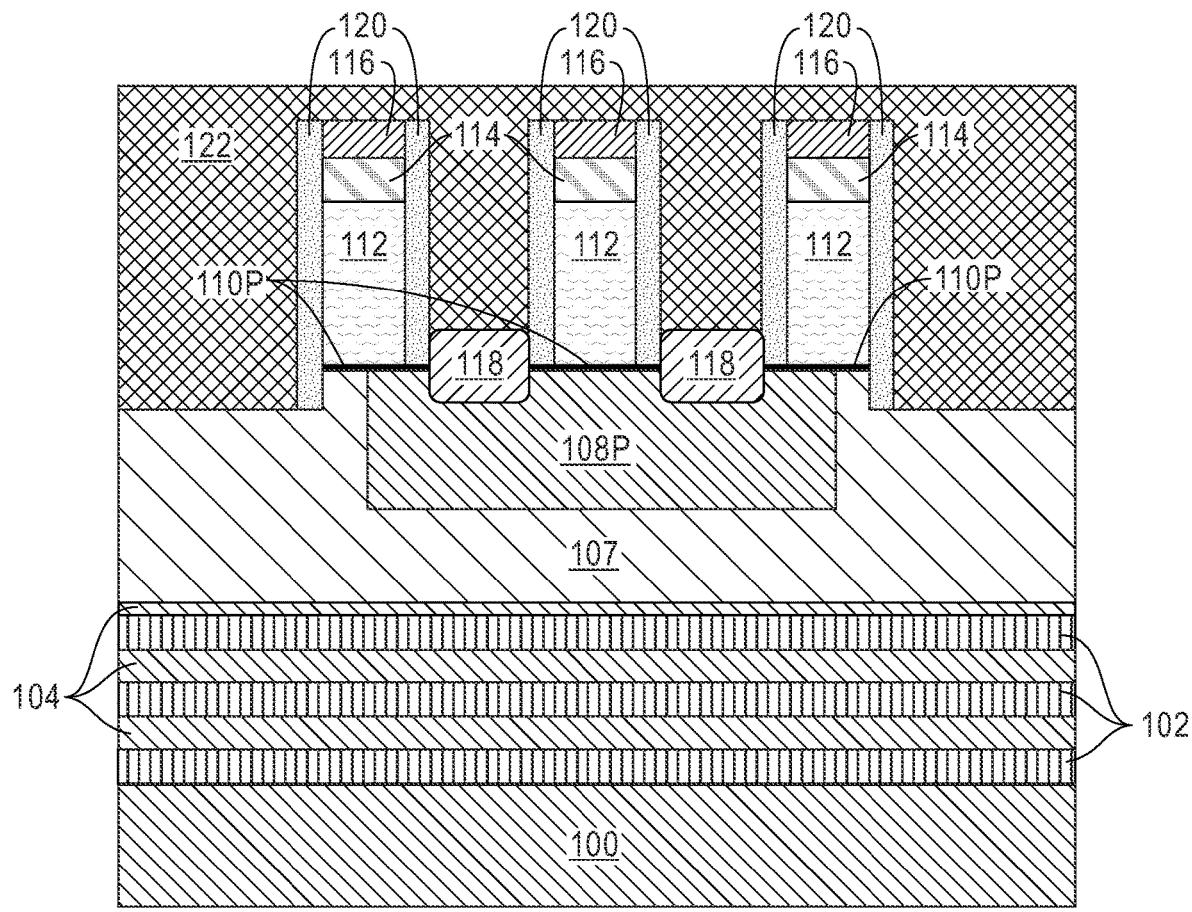
FIG. 15 is a cross sectional view of the exemplary semiconductor structure of FIG. 14 after forming a first gap fill dielectric material.

Referring now to FIG. 15, there is illustrated the exemplary semiconductor structure of FIG. 14 after forming a first gap fill dielectric material 122. First gap fill dielectric material 122 is composed of a dielectric fill material that is compositionally different from the dielectric materials that provides the first dielectric spacers 120, the insulator structure 107, and the topmost hard mask cap of each first sacrificial gate structure. In one embodiment, the dielectric fill material that provides the first gap fill dielectric material 122 is a silicon nitride based dielectric material such as, for example, silicon nitride, silicon boron carbon nitride, or a dielectric including atoms of Si, O, C and N. In another embodiment, the dielectric fill material that provides the first gap fill dielectric material 122 is composed of a silicon carbon based dielectric material such as, for example, silicon carbide or a dielectric including atoms of Si, C and O. Other dielectric materials besides a silicon nitride based dielectric and a silicon carbon based dielectric material can be used as the dielectric fill material. The dielectric fill material can be formed ALD, CVD, PECVD, PVD, evaporation or spin-on coating.

Figure 16:
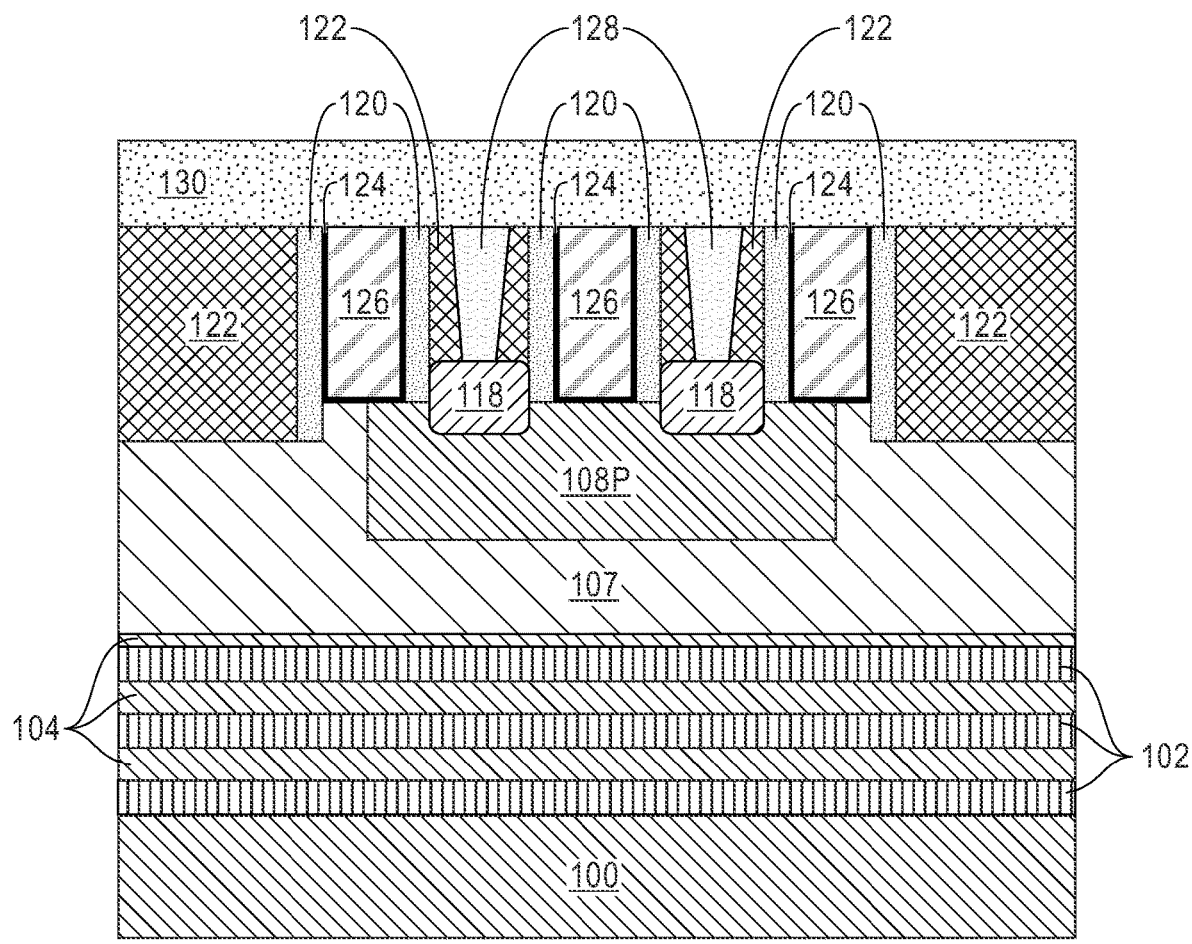
FIG. 16 is a cross sectional view of the exemplary semiconductor structure of FIG. 15 after replacing each first sacrificial gate structure with a first functional gate structure, wherein each first functional gate structure has a first gate length, forming first source/drain contacts, and forming a dielectric bonding layer.

Referring now to FIG. 16, there is illustrated the exemplary semiconductor structure of FIG. 15 after replacing each first sacrificial gate structure 112/114/116 with a first functional gate structure 124/126, wherein each first functional gate structure has a first gate length, GL1, forming first source/drain contacts 128, and forming a dielectric bonding layer 130.

The replacing each first sacrificial gate structure 112/114/116 with a first functional gate structure 124/126 includes first exposing a topmost surface of each first sacrificial gate structure 112/114/116. The exposing a topmost surface of each first sacrificial gate structure 112/114/116 can include a material removal process such as, for example, a planarization process which removes an upper portion of the gap fill dielectric material 122. One or more etching steps are then used to remove each first sacrificial gate structure 112/114/116 as well as the underlying second insulator structure 110P.

The first functional gate structure including at least a first gate dielectric material layer 124 and a first gate electrode 126. An optional first work function setting layer can be formed between the first gate dielectric material layer 124 and a first gate electrode 126. The first gate dielectric material layer 124 includes one of the gate dielectric materials mentioned above for the first gate dielectric material layer 34. The first gate electrode 126 includes one of the conductive materials mentioned above for the first gate electrode 36. The optional first work function setting layer includes one of the previously mentioned first WFMs. The first functional gate structure can be formed by first depositing a layer of the first gat dielectric material, an optional layer of the first WFM, and a layer of the conductive material in the area previously occupied by each first sacrificial gate structure 112/114/116, and the performing a planarization process to remove any of the layer of the first gat dielectric material, the optional layer of the first WFM, and the layer of the conductive material that is present on the gap fill dielectric material 122.

The first source/drain contacts 128 can be formed by forming source/drain contact openings (not shown) in the gap fill dielectric material 122 by lithography and etching, and then filling the contact openings with at least a contact conductor material, as defined herein below.

In some embodiments (not shown), a metal semiconductor alloy region can be formed in each of the source/drain contact openings and on an upper surface of the first source/drain regions 118. The metal semiconductor alloy region can be composed of a silicide or germicide. In one or more embodiments of the present application, the metal semiconductor alloy region can be formed by first depositing a metal layer (not shown) in each of the source/drain contact openings and on an upper surface of the first source/drain regions 118. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the first source/drain regions 118 to provide the metal semiconductor alloy regions. The unreacted portion of the metal layer, and, if present, the diffusion barrier, then removed, for example, by an etch process (or a plurality of etching processes). In one embodiment, the etching process can be a wet etch that removes the metal in the metal layer selective to the metal semiconductor alloy in the metal semiconductor alloy regions. A source/drain contact material is then deposited in the source/drain contact openings to form the first source/drain contacts 128.

The first source/drain contacts 128 can include one or more source/drain contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

A contact conductor material is subsequently deposited into each of the source/drain contact openings to completely fill a remaining volume of the source/drain contact openings. The contact conductor material can include a metal such as, for example, W, Cu, Al, Co, Ru, Mo, Os, Ir, Rh or an alloy thereof. The contact conductor layer can be formed by any suitable deposition method such as, for example, ALD, CVD, PVD or plating. A planarization process can be used to remove the contact conductor material and the contact liner (when provided) that are located outside the source/drain contact openings. The remaining contact conductor material and if present, the contact liner and the metal semiconductor alloy region provide first source/drain contacts 128.

Next, dielectric bonding layer 130 is formed on the gap fill dielectric material 122 and the first functional gate structures 124/126. The dielectric bonding layer 130 is composed of a dielectric material such as, for example, silicon dioxide or silicon nitride. The dielectric bonding layer 130 can be formed by a deposition process such as, for example, CVD, PECVD, or PVD. The dielectric bonding layer 130 can have a thickness from 20 nm to 2000 nm; although thicknesses are contemplated and can be used as the thickness of the dielectric bonding layer 130.

Figure 17:
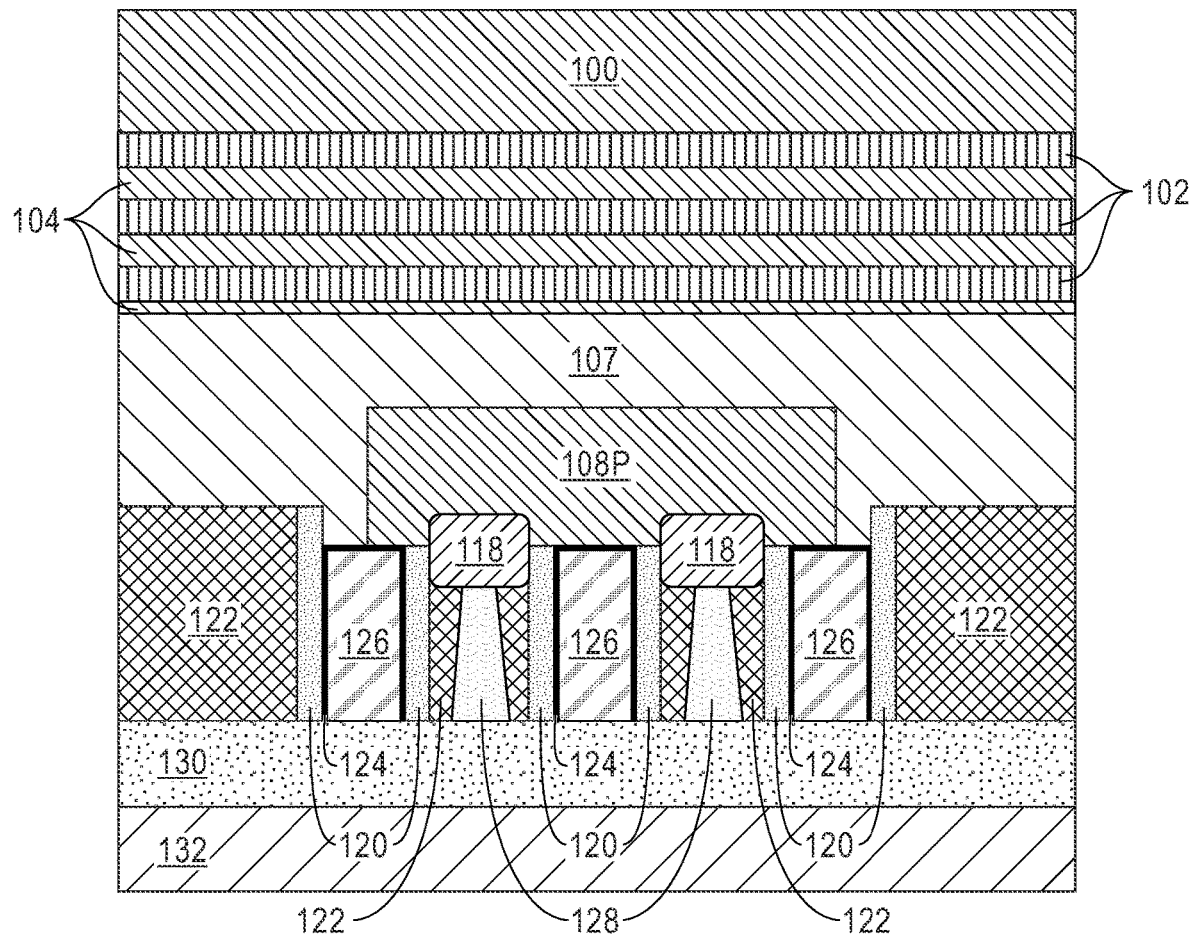
FIG. 17 is a cross sectional view of the exemplary semiconductor structure of FIG. 16 after wafer flipping and forming a wafer carrier on the dielectric bonding layer.

Referring now to FIG. 17, there is illustrated the exemplary semiconductor structure of FIG. 16 after wafer flipping and forming a wafer carrier 132 on the dielectric bonding layer 130. The wafer flipping rotates the exemplary structure shown in FIG. 16 by 1800 such that the semiconductor substrate 100 is now the topmost element of the structure. The wafer flipping can be performed manually or utilizing a robotic arm or other wafer flipping apparatus.

The wafer carrier 132 can include a bulk semiconductor substrate, or a semiconductor-on-insulator substrate, as both defined above for semiconductor substrate 100. Bonding can be achieved utilizing a thermal bonding process or by adhering the wafer carrier 132 to the dielectric bonding layer 130.

Figure 18:
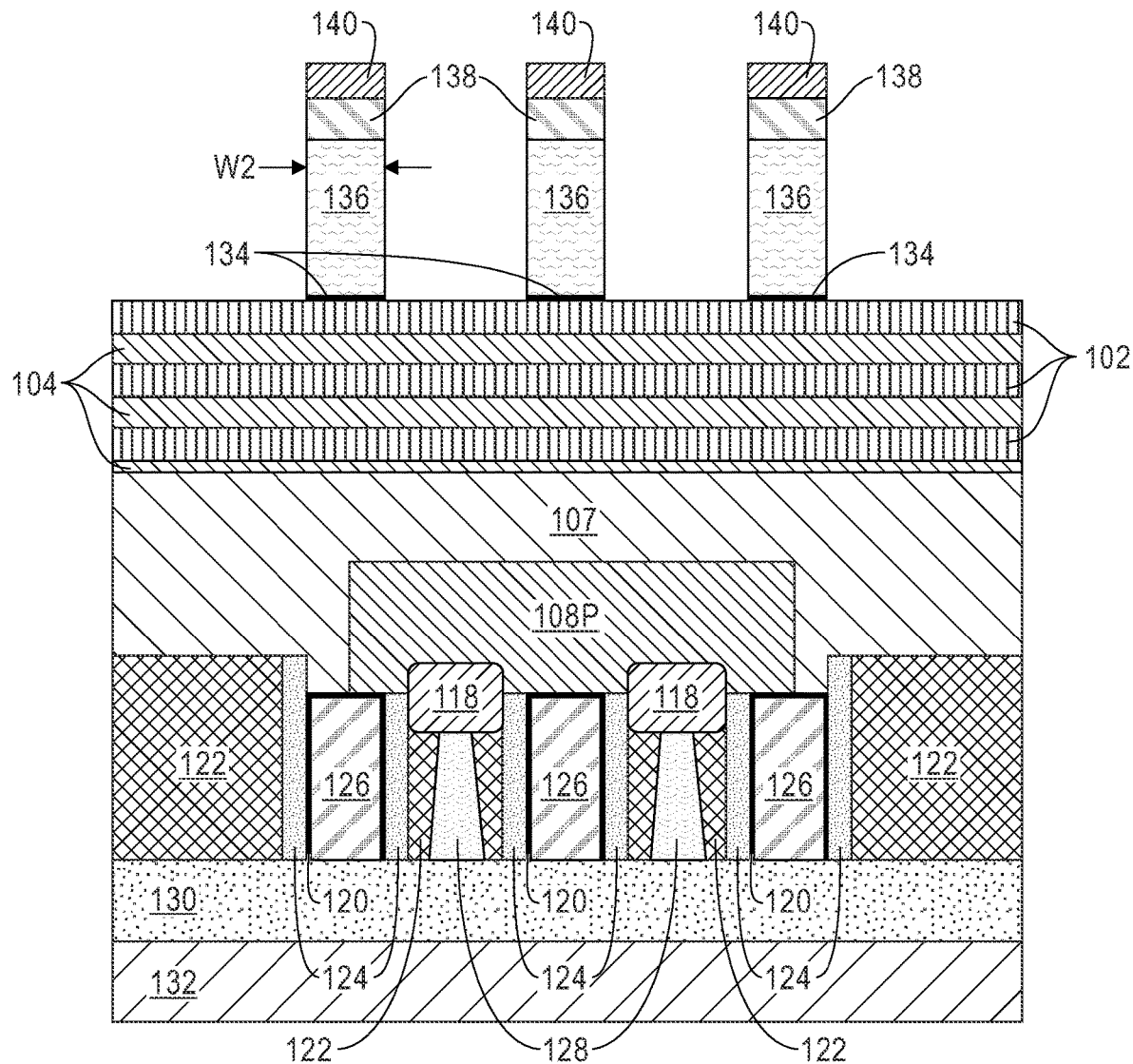
FIG. 18 is a cross sectional view of the exemplary semiconductor structure of FIG. 17 after removing the semiconductor substrate and forming second sacrificial gate structures having a second width that is greater than the first width on a physically exposed surface of a topmost surface of the flipped material stack.

Referring now to FIG. 18, there is illustrated the exemplary semiconductor structure of FIG. 17 after removing the semiconductor substrate 110 and forming second sacrificial gate structures 134/136/138/140 having a second width, W2, that is greater than the first width, W1, on a physically exposed surface of a topmost surface of the flipped material stack.

The semiconductor substrate 110 can be removed utilizing a material removal process such as, for example, a planarization (i.e., grinding and/or chemical mechanical polishing). The material removal process removes the entirety of the semiconductor substrate 110 and stops on an upper surface of the layer of sacrificial material 102 that previously formed an interface with the semiconductor substrate 110.

The second sacrificial gate structures include a second sacrificial gate dielectric material 134, a second sacrificial gate material 136, a bottom hard mask cap 138 and a top hard mask cap 140. In some embodiments, only a single hard mask cap can be employed in the second sacrificial gate structures. In some embodiments, the second sacrificial gate dielectric material 134 can be omitted from the structure.

The second sacrificial gate dielectric material 134 can be composed of a sacrificial gate dielectric material such as, for example, silicon dioxide, silicon nitride, and/or silicon oxynitride. The second sacrificial gate dielectric material 134 can have a thickness from 1 nm to 15 nm, although other thicknesses are contemplated and can be used as the thickness of the second sacrificial gate dielectric material 134.

The second sacrificial gate material 136 can be composed one of the first sacrificial gate material mentioned above for the first sacrificial gate material layer 24L.

The bottom hard mask 138 can be composed of a first hard mask material, while the top hard mask 140 can be composed of a second hard mask material that is compositionally different from the first hard mask material. In one embodiment, the bottom hard mask 138 is composed of silicon nitride, while the top hard mask 140 can be composed of silicon dioxide. Each of the bottom and top hard masks 138, 140 can have a thickness from 20 nm to 100 nm; although other thicknesses for the bottom and top hard masks 138, 140 are contemplated and can be employed in the present application.

Each second sacrificial gate structure can be formed by depositing blanket layers of the sacrificial gate dielectric material, the sacrificial gate material and hard mask materials and then the resultant blanket multilayered material stack is patterned by lithography and etching.

Figure 19:
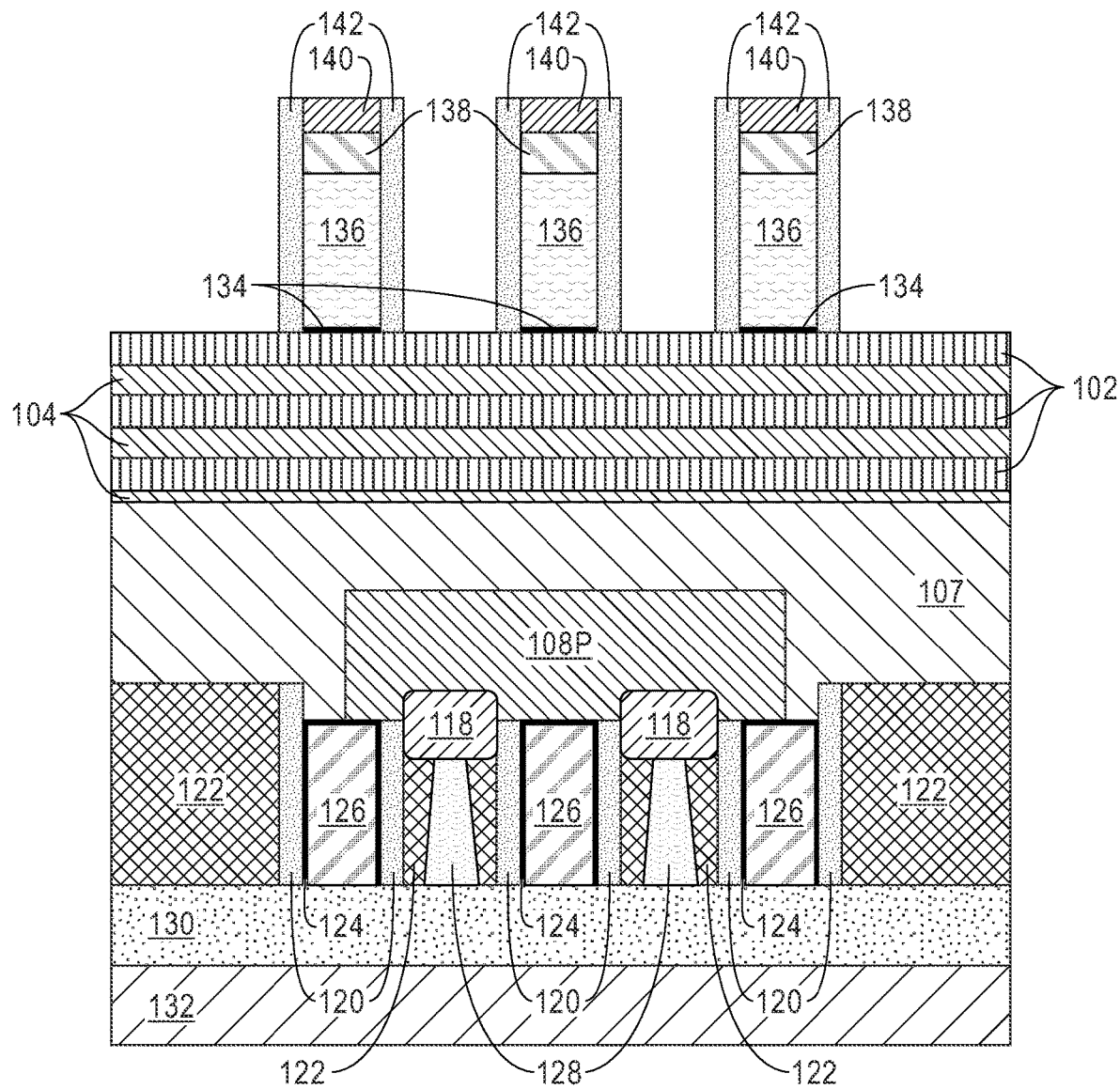
FIG. 19 is a cross sectional view of the exemplary semiconductor structure of FIG. 18 after forming a second dielectric spacer along the sidewall of each second sacrificial gate structure.

Referring now to FIG. 19, there is illustrated the exemplary semiconductor structure of FIG. 18 after forming a second dielectric spacer 142 along the sidewall of each second sacrificial gate structure 134/1367/138/140. The second dielectric spacers 142 are formed along a sidewall of each first sacrificial gate structure 134/1367/138/140. The second dielectric spacers 142 can include one of the dielectric spacer materials mentioned above for dielectric spacer 32. The second dielectric spacers 142 can be formed by depositing the dielectric spacer material, followed by a spacer etch. Each second dielectric spacer 142 can be pillar shaped as is shown in FIG. 19.

Figure 20:
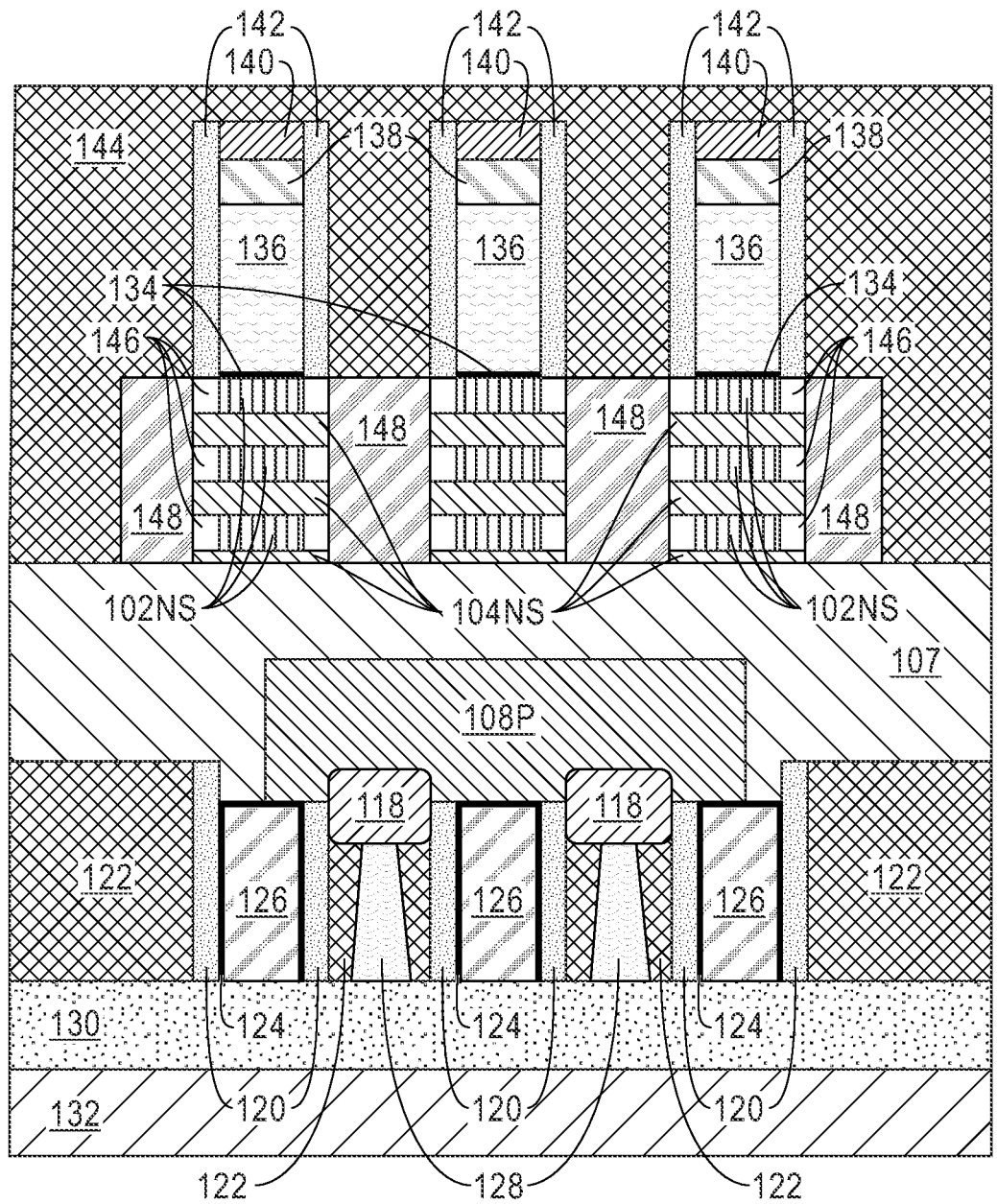
FIG. 20 is a cross sectional view of the exemplary semiconductor structure of FIG. 19 after further device processing forming a nanosheet stack containing alternating nanosheets of sacrificial semiconductor material and semiconductor channel material from the material stack, recessing the nanosheets of sacrificial semiconductor material, forming an inner dielectric spacer, forming second source/drain regions, and forming a second gap fill dielectric material.

Referring now to FIG. 20, there is illustrated the exemplary semiconductor structure of FIG. 19 after further device processing including forming at least one nanosheet stack containing alternating nanosheets of sacrificial semiconductor material 102NS and semiconductor channel material 104NS from the material stack, recessing the nanosheets of sacrificial semiconductor material 102NS, forming an inter dielectric spacer 146, forming second source/drain regions 148, and forming a second gap fill dielectric material 144.

As stated above, the further device processing includes forming at least one nanosheet stack containing alternating nanosheets of sacrificial semiconductor material 102NS and semiconductor channel material 104NS from the material stack, MS2. Each nanosheet of sacrificial semiconductor material 102NS includes a remaining portion of the layer of sacrificial semiconductor material 102, and each nanosheet of semiconductor channel material 104NS includes the layer of a semiconductor channel material 104. The alternating nanosheets of sacrificial semiconductor material 102NS and semiconductor channel materials 104NS that comprise the nanosheet stack have a reduced width as compared to the alternating layers of sacrificial semiconductor material 102 and semiconductor channel materials 104 present in material stack, MS2. The height of the nanosheets of sacrificial semiconductor material 102NS and semiconductor channel materials 104NS is the same as that of the alternating layers of sacrificial semiconductor material 102 and semiconductor channel materials 104 present in material stack, MS2.

The at least one nanosheet stack is formed by removing portions of the material stack, MS2 that are not protected by the second sacrificial gate structure and the second dielectric spacers 142. The removing includes one or more etching processes.

After forming the least one the nanosheet stack, each nanosheet of sacrificial channel material is recessed utilizing a lateral recess etch process that selectively removes end portions of the nanosheet of sacrificial channel material 102NS relative to the nanosheets of semiconductor channel material 104NS; no recessing of the nanosheets of semiconductor channel material 104NS occurs. A gap is formed at the end of each of the recessed nanosheets sacrificial channel material 102NS. Inner dielectric spacer 146 is then formed into the gaps. Each inner dielectric spacer 146 includes one of the dielectric spacer materials mentioned above for dielectric spacer 32. The dielectric spacer material that provides each inner dielectric spacer 146 can be compositionally the same as, or compositionally different from, the dielectric spacer material that provides the second dielectric spacer 142. Each inner dielectric spacer 146 can be formed by deposition of the dielectric spacer material, followed by a spacer etch. Each inner dielectric spacer 146 has an outermost sidewall that is vertically aligned to an outermost sidewall of each nanosheet of semiconductor channel material 104NS.

After forming inner dielectric spacer 146, second source/drain region 148 are formed. The second source/drain regions 148 includes a semiconductor material and a dopant as defined above for bottom source/drain regions 46. The second source/drain regions 148 can be formed utilizing the same process as mentioned above for forming the bottom source/drain regions 46.

Next, second gap fill dielectric material 144 is formed. Second gap fill dielectric material 144 includes one of the materials mentioned above for the first gap fill dielectric material 122. The second gate fill dielectric material 144 can be formed utilizing the process mentioned above for forming the first gap fill dielectric material 122. The second gap fill dielectric material 144 is formed laterally adjacent to, and atop each second sacrificial gate structure.

Figure 21:
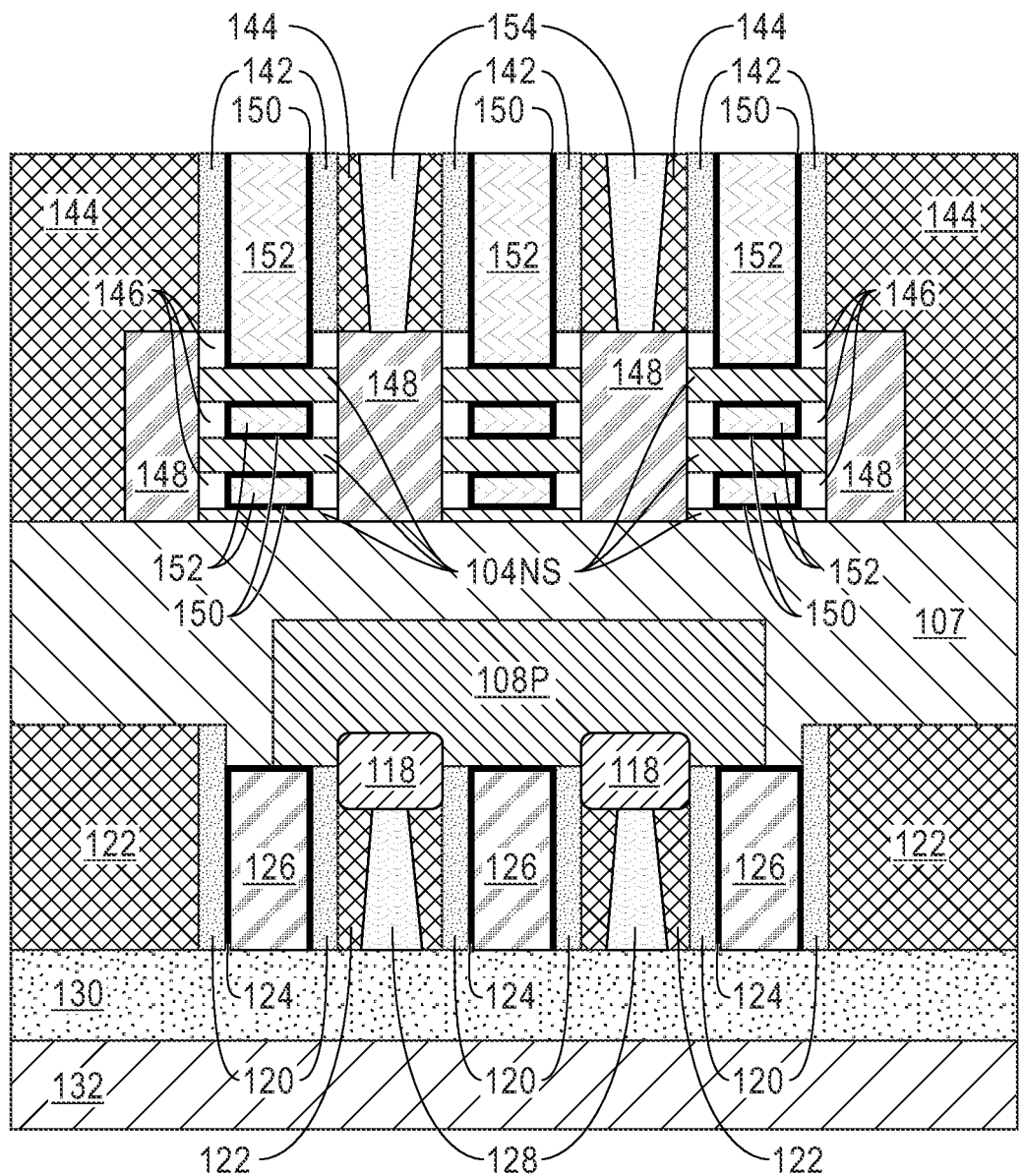
FIG. 21 is a cross sectional view of the exemplary semiconductor structure of FIG. 20 after replacing each second sacrificial gate structure with a second functional gate structure and forming second source/drain contacts.

Referring now to FIG. 21, there is illustrated the exemplary semiconductor structure of FIG. 20 after replacing each second sacrificial gate structure 134/136/138/140 with a second functional gate structure 150/152 and forming second source/drain contacts 154.

The replacing second sacrificial gate structure 134/136/138/140 with a second functional gate structure 150/152 includes first exposing a second sacrificial gate structure 134/136/138/140. The exposing a topmost surface of each second sacrificial gate structure 134/136/138/140 can include a material removal process such as, for example, a planarization process which removes an upper portion of the second gap fill dielectric material 142. One or more etching steps are then used to remove each second sacrificial gate structure 134/136/138/140.

The second functional gate structure including at least a second gate dielectric material layer 150 and a second gate electrode 152. An optional second work function setting layer can be formed between the second gate dielectric material layer 150 and the second gate electrode 152. The second gate dielectric material layer 150 includes one of the gate dielectric materials mentioned above for the first gate dielectric material layer 34. The second gate dielectric material layer 150 can be compositionally the same as, of compositionally different from the first gate dielectric material layer 124. The second gate electrode 150 includes one of the conductive materials mentioned above for the first gate electrode 36. The second gate electrode 150 can be compositionally the same, or compositionally different from, the first gate electrode 126. The optional second work function setting layer includes one of the previously mentioned first WFMs. The optional second work function setting layer is typically compositionally different from the optional first work function layer that can be positioned between he first gate dielectric material layer 124 and the first electrode 136. The second functional gate structure can be formed by first depositing a layer of a gate dielectric material, an optional layer of WFM, and a layer of conductive material in the area previously occupied by each second sacrificial gate structure 134/136/138/140, and the performing a planarization process to remove any of the layer of the gate dielectric material, the optional layer of WFM, and the layer of conductive material that is present on the second gap fill dielectric material 144.

The second source/drain contacts 154 include materials mentioned above for the first source/drain contacts 128. The second source/drain contacts 154 can be formed utilizing the technique mentioned above for forming the first source/drain contacts 128. The second source/drain contacts 154 contact a surface of the second source/drain regions 146.

In FIG. 21, the first functional gate structure 124/126 that is formed on the semiconductor fin 108P can be referred to as a FinFET, while the second functional gate structure 150/152 that is formed in a wrap-around fashion about the vertical nanosheet stack of semiconductor channel material nanosheets 104NS can be referred to as a nanosheet FET. Thus, and in this embodiment, the nanosheet FET has a gate length that is less than a gate length of the FinFET that is vertically stacked below the nanosheet FET. Although not shown, it is possible to provide a structure such as is shown in FIG. 21, in which the gate length of the nanosheet FET is greater than the gate length of the FinFET. This can be done by providing the first sacrificial gate structure with a width that is less than the width of the second sacrificial gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application is not limited to the exact forms and details described and illustrated, but fall within the scope of the appended claims.

What is claimed is:

1. A semiconductor structure comprising:
a bottom field effect transistor (FET) and a top FET stacked in a vertical manner one atop the other and separated by an insulator structure, wherein the bottom FET has a first gate length, and the top FET has a second gate length that differs from the first gate length, wherein the bottom FET is a FinFET, and the top FET is a nanosheet FET and wherein the FinFET comprises a semiconductor fin embedded in the insulator structure, and wherein the FinFET comprises a first functional gate structure located beneath the semiconductor fin; and
a dielectric bonding layer located beneath the FinFET and spaced apart from the insulator structure, wherein the dielectric bonding layer is in direct physical contact with a first gate electrode of the first functional gate structure of the FinFET.

2. The semiconductor structure of claim 1, wherein the first gate length is greater than the second gate length.

3. The semiconductor structure of claim 1, wherein the first gate length is less than the second gate length.

4. The semiconductor structure of claim 1, wherein the nanosheet FET comprises a second functional gate structure wrapped around a vertical nanosheet stack of spaced apart semiconductor channel material nanosheets.

5. The semiconductor structure of claim 4, further comprising a first source/drain region located on the semiconductor fin, and a second source/drain region laterally adjacent to, and in direct physical contact with, the vertical nanosheet stack of spaced apart semiconductor channel material nanosheets.

6. The semiconductor structure of claim 5, further comprising a first source/drain contact structure contacting the first source/drain region, wherein the first source/drain contact structure is located entirely beneath the semiconductor fin.

* * * * *